United States Patent
De La Vega et al.

(10) Patent No.: US 11,590,567 B2
(45) Date of Patent: Feb. 28, 2023

(54) NANOMETRIC COPPER FORMULATIONS

(71) Applicant: P.V. NANO CELL LTD., Migdal Haemek (IL)

(72) Inventors: Fernando De La Vega, Zichron Yaakov (IL); Semyon Melamed, Kiryat Yam (IL)

(73) Assignee: P.V. NANO CELL LTD., Migdal Haemek (IL)

( * ) Notice: Subject to any disclaimer, the term of this patent is extended or adjusted under 35 U.S.C. 154(b) by 339 days.

(21) Appl. No.: 16/202,135

(22) Filed: Nov. 28, 2018

(65) Prior Publication Data
US 2019/0291180 A1  Sep. 26, 2019

Related U.S. Application Data

(63) Continuation of application No. 15/122,185, filed as application No. PCT/IB2015/051536 on Mar. 3, 2015, now Pat. No. 10,166,602.

(30) Foreign Application Priority Data

Mar. 3, 2014 (GB) ...................... 1403731

(51) Int. Cl.
*B32B 5/16* (2006.01)
*C30B 7/14* (2006.01)
(Continued)

(52) U.S. Cl.
CPC .............. *B22F 1/0545* (2022.01); *B22F 1/16* (2022.01); *B22F 9/24* (2013.01); *C30B 7/14* (2013.01); *C30B 29/02* (2013.01); *H05K 1/097* (2013.01)

(58) Field of Classification Search
None
See application file for complete search history.

(56) References Cited

U.S. PATENT DOCUMENTS

| 6,730,400 B1 | 5/2004 | Komatsu et al. |
| 9,556,350 B2 | 1/2017 | De La Vega et al. |

(Continued)

FOREIGN PATENT DOCUMENTS

| CN | 103282969 B | 8/2016 |
| JP | 2003342605 A | 12/2003 |

(Continued)

OTHER PUBLICATIONS

Lai et al., Synthesis of Highly Stable Dispersions of Copper Nanoparticles Using Sodium Hypophosphite, J. Appl. Polym. Sci. 128: 1443-1449, 2013, DOI: 10.1002/APP.38109 (Year: 2012).*

(Continued)

*Primary Examiner* — Hoa (Holly) Le
(74) *Attorney, Agent, or Firm* — Daniel Feigelson

(57) ABSTRACT

A formulation containing particulate matter including nanometric metallic copper particles, at least 10% of the particulate matter being single-crystal metallic copper particles, the particulate matter having an average secondary particle size ($d_{50}$) within a range of 20 to 200 nanometers, the nanometric metallic copper particles being at least partially covered by at least one dispersant; a concentration ratio of crystalline cuprous oxide particles to the nanometric metallic copper particles, within the particulate matter, being at most 0.4; the formulation including a solvent, the particulate matter and the solvent forming a dispersion.

13 Claims, 6 Drawing Sheets

(51) Int. Cl.
  B22F 1/0545 (2022.01)
  B22F 9/24 (2006.01)
  C30B 29/02 (2006.01)
  H05K 1/09 (2006.01)
  B22F 1/16 (2022.01)

(56) References Cited

U.S. PATENT DOCUMENTS

| | | | |
|---|---|---|---|
| 2004/0089101 A1 | 5/2004 | Winter et al. | |
| 2005/0097987 A1 | 5/2005 | Kodas et al. | |
| 2006/0016371 A1 | 1/2006 | Yadav | |
| 2011/0143051 A1* | 6/2011 | Ohashi | C09D 11/101 427/553 |
| 2011/0218304 A1* | 9/2011 | Shi | C08F 8/42 525/371 |
| 2012/0100303 A1 | 4/2012 | Kim et al. | |
| 2012/0251736 A1* | 10/2012 | Hong | C09D 11/52 427/559 |
| 2013/0230717 A1 | 9/2013 | Xia et al. | |
| 2013/0270490 A1 | 10/2013 | De La Vega et al. | |
| 2016/0368048 A1* | 12/2016 | De La Vega | C30B 29/60 |
| 2017/0073538 A1 | 3/2017 | Kawasaki et al. | |
| 2017/0197244 A1 | 7/2017 | Choi et al. | |
| 2022/0049277 A1* | 2/2022 | Sahi | A61K 33/242 |

FOREIGN PATENT DOCUMENTS

| | | |
|---|---|---|
| RU | 2398621 C2 | 9/2010 |
| WO | 2010/035258 A2 | 4/2010 |
| WO | 2013/035366 A1 | 3/2013 |

OTHER PUBLICATIONS

Liu et al., Effects of reaction parameters on preparation of Cu nanoparticles via aqueous solution reduction method with NaBH4, Trans. Nonferrous Met Soc. China 22(2012) 2991-2996 (Year: 2012).*

Wu et al., One-step green route to narrowly dispersed copper nanocrystals, Journal of Nanoparticle Research (2006) 8:965-969, DOI 10.1007/s 11051-005-9065-2 (Year: 2006).*

Chan, Plasmonic Properties of Copper Nanoparticles Fabricated by Nanosphere Lithography, Nano Letters 2007 vol. 7, No. 7 1947-1952 (Year: 2007).*

Aissa et al., Copper nanoparticles of well-controlled size and shape: a new advance in synthesis and self-organization, Nanoscale, 2015, 7, 3189 (Year: 2015).*

Wang et al., The synthesis and tribological characteristics of triangular copper nanoplates as a grease additive, RSC Adv., 2017, 7, 40249 (Year: 2017).*

"Fabrication of Copper Nanoparticles: Advances in Synthesis, Morphology Control, and Chemical Stability.", Recent Patents on Nanotechnology., vol. 7, No. 2, Dec. 31, 2013 (Dec. 31, 2013), pp. 108-132., XP055321603, ISSN: 2212-4020.

Pagana et al., "Applied Pilot-Scale Studies on Ceramic Membrane Processes for the Treatment of Wastewater Streams" (Global NEST Journal, vol. 8, No. 1, pp. 23-30, 2006).

Wen et al., "Synthesis of Cu nanoparticles for large-scale preparation", Materials Science and Engineering B, 177 (8):619-624, Feb. 19, 2012, Elsevier publishing, Amsterdam.

Fang et al., "Synthesis of stable and disperse copper nanoparticle colloids via solution chemical reduction", "Materials Review" vol. 27, Issue 4, pp. 32-35, Apr. 25, 2013.

Huang et al., "Grain boundary structure of nanocrystalline Cu processed by cryomilling", Philosophical Magazine, 2003, vol. 83, No. 12, 1407-1419.

Champion et al., "Characterization of nanocrystalline copper powders prepared by melting in a cryogenic liquid", Materials Science and Engineering A 217/218 (1996) 58-63.

Champion et al., "Preparation and characterization of nanocrystalline copper powders", Scripta Materialia vol. 35 No. 4., pp. 517-522, 1996.

* cited by examiner

NANOMETRIC COPPER FORMULATIONS

This is a continuation of U.S. Ser. No. 15/122,185, entitled "Nanometric Copper Formulations" which is the national stage of PCT/IB2015/051536, filed 3 Mar. 2015 and also entitled "Nanometric Copper Formulations", which claims priority from GB 1403731.1, filed 3 Mar. 2014 and also entitled "Nanometric Copper Formulations", the contents of which are incorporated herein by reference.

FIELD OF THE INVENTION

The present invention relates to nanometric copper formulations and stable dispersions containing single-crystal metallic copper particles, and to methods of producing such formulations and dispersions.

SUMMARY OF THE INVENTION

According to some teachings of the present invention there is provided a formulation including particulate matter including nanometric metallic copper particles, at least 10% of the particulate matter being single-crystal metallic copper particles, the particulate matter having an average secondary particle size ($d_{50}$) within a range of 20 to 200 nanometers (nm), the nanometric metallic copper particles being at least partially covered by at least one dispersant; a concentration ratio of crystalline cuprous oxide to the nanometric metallic copper particles, within the particulate matter, being at most 0.4.

According to another aspect of the present invention there is provided a process including the steps of: (a) adding a borohydride to cupric ions in an acidic aqueous medium, in a presence of a dispersant, to reduce the cupric ions and to produce the nanometric metallic copper particles in a first dispersion; and (b) providing the nanometric metallic copper particles in a product dispersion.

According to another aspect of the present invention there is provided a formulation produced according to this process.

According to another aspect of the present invention there is provided a process for producing a formulation containing nanometric metallic copper particles, including: (a) adding a borohydride to cupric ions in an aqueous medium, at an acidic pH, to reduce the cupric ions, in a presence of a first dispersant, and to produce the nanometric metallic copper particles in a first dispersion; and (b) separating off at least a portion of the aqueous medium from the nanometric metallic copper particles.

According to still further features in the described preferred embodiments, the process further includes curtailing the incremental addition when a pH of the aqueous medium is at most 7, or when a pH of the aqueous medium is within a range of 2.5 to 7, within a range of 2.5 to 6.5, or within a range of 2.5 to 6.

According to still further features in the described preferred embodiments, the process further includes treating the first dispersion so as to provide the nanometric metallic copper particles in a product dispersion.

According to further features in the described preferred embodiments, the concentration ratio is at most 0.35, at most 0.30, at most 0.25, at most 0.20, at most 0.15, at most 0.12, at most 0.10, at most 0.08, at most 0.06, at most 0.05, at most 0.04, or at most 0.035.

According to still further features in the described preferred embodiments, the average secondary particle size is at most 180 nm, at most 150 nm, at most 120 nm, at most 100 nm, or at most 80 nm.

According to still further features in the described preferred embodiments, the average secondary particle size is at least 25 nm, at least 30 nm, at least 35 nm, at least 40 nm, at least 45 nm, or at least 50 nm.

According to still further features in the described preferred embodiments, at least 15%, at least 20%, at least 25%, at least 30%, at least 40%, at least 50%, at least 60%, at least 70%, or at least 80% of the particulate matter are single-crystal metallic copper particles. Typically, a majority of the particles in the particulate matter may be single-crystal metallic copper particles.

According to still further features in the described preferred embodiments, a specific electrical resistivity of the copper particles, after standard thermal sintering, is at most $5 \times 10^{-3}$ ohm·cm, at most $2 \times 10^{-3}$ ohm·cm, at most $1 \times 10^{-3}$ ohm·cm, at most $5 \times 10^{-4}$ ohm·cm, at most $2 \times 10^{-4}$ ohm·cm, or at most $1 \times 10^{-4}$ ohm·cm.

According to still further features in the described preferred embodiments, a specific electrical resistivity of the copper particles, after standard thermal sintering, is within a range of $5 \times 10^{-5}$ to $5 \times 10^{-3}$ ohm·cm, within a range of $8 \times 10^{-5}$ to $2 \times 10^{-3}$ ohm·cm, or within a range of $1 \times 10^{-4}$ to $1 \times 10^{-3}$ ohm·cm.

According to still further features in the described preferred embodiments, the dispersant includes, primarily includes, or consists essentially of polyvinylpyrrolidone (PAT) or pure polyvinylpyrrolidone.

According to still further features in the described preferred embodiments, the dispersant includes, or primarily includes, at least one dispersant selected from the group consisting of polyvinylpyrrolidone (PVP), gum arabic, polyvinyl alcohol (PVA), polyacrylic acid (PAA), polyallylamine (PAAm), polysodium styrene sulfonate (PSS), 3-(aminopropyl)trimethoxysilane (APS), a fatty acid, lauryl amine, cetyltrimethylammonium bromide (CTAB), and tetraoctylammonium bromide (TOAB).

According to still further features in the described preferred embodiments, a weight average molecular weight of the dispersant is within a range of 8,000 to 500,000, 10,000 to 500,000, 15,000 to 500,000, 20,000 to 500,000, 30,000 to 500,000, 15,000 to 300,000, 15,000, to 200,000, 15,000 to 150,000, or 30,000 to 150,000.

According to still further features in the described preferred embodiments, the formulation further includes at least a first solvent, the particulate matter and the solvent forming a dispersion.

According to still further features in the described preferred embodiments, the concentration of the particulate matter within the dispersion is within a range of 5% to 90%, 5% to 85%, 5% to 80%, 5% to 75%, 5% to 70%, 5% to 65%, 10% to 75%, 10% to 70%, 10% to 65%, 15% to 80%, 15% to 70%, 15% to 65%, 20% to 75%, 25% to 75%, 30% to 75%, 20% to 65%, 25% to 65%, 25% to 60%, 25% to 55%, 30% to 60%, 30% to 55%, or 30% to 65%, by weight.

According to still further features in the described preferred embodiments, the concentration of the particulate matter within the dispersion is at least 35%, at least 40%, at least 45%, or at least 50%, by weight.

According to still further features in the described preferred embodiments, the first solvent includes, or primarily includes, an alcohol.

According to still further features in the described preferred embodiments, the alcohol includes at least one alcohol selected from the group consisting of methanol, ethanol, isopropanol, benzyl alcohol, and terpineol.

According to still further features in the described preferred embodiments, the first solvent includes, or primarily includes, at least one solvent selected from the group consisting of a glycol and a glycol ether.

According to still further features in the described preferred embodiments, the glycol is selected from the group of glycols consisting of an ethylene glycol, a propylene glycol, a butylene glycol, a pentylene glycol, and a hexylene glycol.

According to still further features in the described preferred embodiments, the glycol includes, or primarily includes, at least one of diethyleneglycol and triethyleneglycol.

According to still further features in the described preferred embodiments, the glycol ether is selected from the group of glycol ethers consisting of an ethylene glycol ether and a propylene glycol ether.

According to still further features in the described preferred embodiments, the glycol ether includes at least one glycol ether selected from the group of glycol ethers consisting of propylene glycol monomethyl ether, propylene glycol monoethyl ether, propylene glycol monopropyl ether, propylene glycol monobutyl ether, propylene glycol mono-t-butyl ether, propylene glycol monophenyl ether, dipropylene glycol monomethyl ether, dipropylene glycol monoethyl ether, dipropylene glycol monopropyl ether, dipropylene glycol monobutyl ether, propylene glycol mono-t-butyl ether, tripropylene glycol monopropyl ether, and tripropylene glycol monobutyl ether.

According to still further features in the described preferred embodiments, the glycol ether includes at least one glycol ether selected from the group of glycol ethers consisting of ethylene glycol monotnethyl ether, ethylene glycol monoethyl ether, ethylene glycol monopropyl ether, ethylene glycol monobutyl ether, ethylene glycol monophenyl ether, diethylene glycol monomethyl ether, diethylene glycol monoethyl ether, diethylene glycol monopropyl ether, diethylene glycol monobutyl ether, diethylene glycol mono-t-butyl ether, triethylene glycol monopropyl ether, and triethylene glycol monobutyl ether.

According to still further features in the described preferred embodiments, a weight ratio of the at least one dispersant to the particulate matter is at least 0.015, at least 0.016, at least 0.017, at least 0.018, at least 0.019, or at least 0.020.

According to still further features in the described preferred embodiments, the weight ratio of the dispersant to the particulate matter is at most 0.2, at most 0.16, at most 0.12, at most 0.08, at most 0.05, at most 0.04, at most 0.03, at most 0.025, at most 0.022, or at most 0.020.

According to still further features in the described preferred embodiments, the particulate matter is disposed within a dispersion, a concentration of the particulate matter within the dispersion being within a range of 20% to 65%, or a range of 20% to 60%, an amount of the dispersant being at most 4%, by weight, of a weight of the copper particles, a viscosity of the dispersion being at most 70 cP, at most 60 cP, at most 50 cP, or at most 45 cP at 25° C.

According to still further features in the described preferred embodiments, the concentration of the particulate matter within the dispersion is at least 25% or at least 30%, and more typically, at least 35%, at least 40%, at least 45%, or at least 50%.

According to still further features in the described preferred embodiments, the particulate matter is adapted, and the dispersant and the solvent are selected, such that a cuprous oxide concentration is substantially maintained over the course of at least 2 months, at least 3 months, at least 4 months, at least 6 months, or at least 12 months.

According to still further features in the described preferred embodiments, the particulate matter is adapted, and the dispersant and the solvent are selected, such that a cuprous oxide concentration is maintained, on an absolute percentage basis, within 2 percent, within 1.5 percent, or within 1 percent, over the course of at least 2 months, at least 3 months, at least 4 months, at least 6 months, or at least 12 months.

According to still further features in the described preferred embodiments, the crystalline cuprous oxide has a particular cuprous oxide concentration ($Cu_2O$ conc.(i)) within the formulation, at an initial time, and the particulate matter is adapted and the dispersant and the solvent are selected such that within the formulation, an increase in crystalline cuprous oxide concentration after the initial time, normalized by a total initial concentration of copper (% Cu total), is maintained within a value (V) of the particular cuprous oxide concentration, the value expressed as a percentage and defined by:

$$V = 100 \cdot (Cu_2O\ conc.(t) - Cu_2O\ conc.(i))/(\%\ Cu\ total),$$

$Cu_2O$ conc.(t) being a concentration of crystalline $Cu_2O$ evaluated at an elapsed time (t), with respect to the initial time; the value (V) being at most 3%, the elapsed time (t) being at least 2 months.

According to still further features in the described preferred embodiments, the value (V) is at most 2%, at most 1.5%, at most 1%, at most 0.8%, at most 0.6%, at most 0.5%, or at most 0.4%.

According to still further features in the described preferred embodiments, the elapsed time is at least 3 months, at least 4 months, at least 6 months, or at least 12 months.

According to still further features in the described preferred embodiments, the formulation is produced according to a process including the steps of: (a) adding a borohydride to cupric ions in an acidic aqueous medium, in a presence of a dispersant, to reduce the cupric ions and to produce the nanometric metallic copper particles in a first dispersion; and (b) providing the nanometric metallic copper particles in the product dispersion.

According to still further features in the described preferred embodiments, the process further includes curtailing the incremental addition when a pH of the aqueous medium is at most 7.

According to still further features in the described preferred embodiments, the process further includes: curtailing the incremental addition when a pH of the aqueous medium is within a range of 2.5 to 7, within a range of 2.5 to 6.5, or within a range of 2.5 to 6.

According to still further features in the described preferred embodiments, the borohydride includes, primarily includes, or consists substantially of, sodium borohydride or potassium borohydride.

According to still further features in the described preferred embodiments, the process further includes introducing a second dispersant within the product dispersion.

According to still further features in the described preferred embodiments, the second dispersant includes, primarily includes, or consists essentially of polyvinylpyrrolidone (PVP)

According to still further features in the described preferred embodiments, the adding of the borohydride is performed over the course of at least 15 minutes, at least 30 minutes, or at least 60 minutes.

According to still further features in the described preferred embodiments, subsequent to step (a), the nanometric metallic copper particles are washed and concentrated.

According to still further features in the described preferred embodiments, the aqueous medium achieves a pH below 1.5, below 1.0, or below 0.5 during step (a).

According to still further features in the described preferred embodiments, subsequent to step (a), the process includes exchanging at least a portion of the aqueous medium from the particles to produce the product dispersion.

According to still further features in the described preferred embodiments, the exchanging includes concentrating the particulate matter to form the product dispersion, the product dispersion being concentrated in the particulate matter, with respect to the first dispersion.

According to still further features in the described preferred embodiments, the process further includes aging the dispersion for at least 6 months, at least 9 months, at least 12 months, at least 18 months, or at least 24 months, while maintaining at least 10% of the particulate matter as single-crystal metallic copper particles, and while maintaining the average secondary particle size of the particulate matter within the product dispersion within a range of 20 to 200 nm.

BRIEF DESCRIPTION OF THE FIGURES

The foregoing discussion will be understood more readily from the following detailed description of the invention, when taken in conjunction with the accompanying FIGS. (1-6), in which.

DESCRIPTION OF THE PREFERRED EMBODIMENTS

Figure 1:
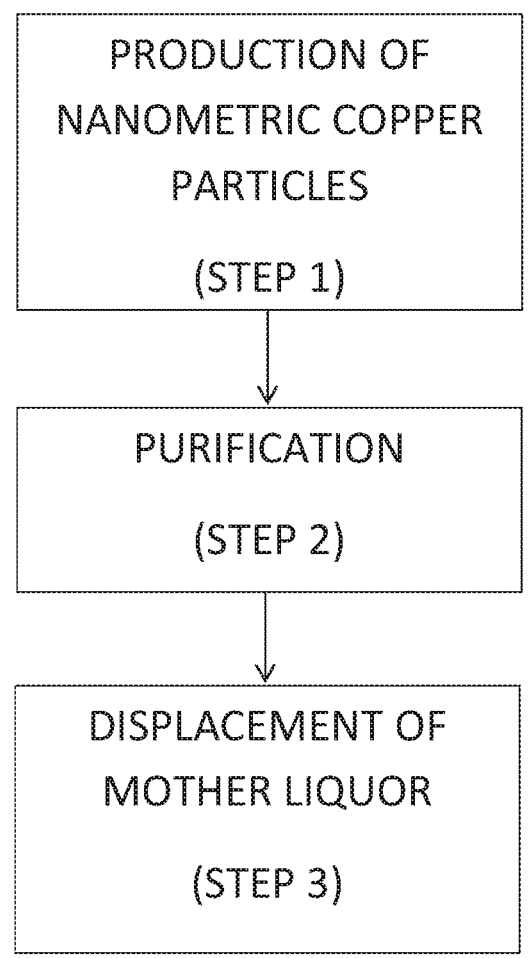
FIG. 1 is a schematic block diagram of a process for producing a nanometric copper product, according to one aspect of the present invention.

The principles of the inventive formulations and dispersions containing nanometric single-crystal metallic copper particles, and of the inventive methods of producing such formulations and dispersions, may be better understood with reference to the drawings and the accompanying description.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

We have discovered a method of producing nanometric copper particles in which a large fraction of the particles are single-crystal particles. However, we have found the production of stable dispersions of these nanometric copper particles to be an extremely complex, and sometimes counterintuitive, matter. The production of stable dispersions may be particularly problematic when producing such dispersions directly in various organic solvents that may be used in the final product dispersions. In addition, the production of stable dispersions from pre-made (e.g., commercially available) nanometric copper particles has also been found to be extremely difficult and unpredictable.

These challenges notwithstanding, we have surprisingly discovered a method of purifying such nanometric copper particles while maintaining a stable dispersion, whereby single-crystal nanometric copper particles retain their monocrystalline nature, even during contact or displacement with organic solvents, and during the formulation of concentrated dispersions having at least 2% copper, by weight, and more typically, at least 10%, at least 20%, at least 30%, at least 40%, at least 50%, at least 60%, at least 70%, at least 80%, or up to 90% copper, by weight.

Moreover, the inventive method may advantageously produce—without agglomeration—concentrated dispersions containing particulate matter including mostly or predominantly single-crystal copper particles, the particulate matter (and typically, the single-crystal copper particles) being characterized by an average secondary particle size of at least 20 nm, at least 25 nm, at least 30 nm, at least 35 nm, at least 40 nm, at least 45 nm, or at least 50 nm. The particulate matter (and typically, the single crystal copper particles) in the dispersions may have an average secondary particle size of at most 200 nm or at most 180 nm, and more typically, at most 150 nm, at most 120 nm, at most 100 nm, or at most 80 nm.

We believe that the single-crystal structure of the copper particles is a decisive factor in attaining, after sintering, low specific electric resistivity values. We further believe that the single-crystal structure of the copper particles enables the formulation of highly concentrated dispersions of copper nanoparticles, without undergoing appreciable agglomeration.

Although it may be possible to produce single-crystal copper nanoparticles according to other methods, the dispersions of the present invention may be distinguished in at least one of several ways, including:

1. average secondary particle size ($d_{50}$);
2. concentration of the copper particles within the dispersion;
3. percentage of single crystal copper particles within the copper particles, by weight;
4. concentration ratio of crystalline cuprous oxide to crystalline nanometric metallic copper;
5. electrical resistivity of the particulate matter, following thermal sintering of the particulate matter; and
6. viscosity of the dispersion.

1. Average Particle Size

In the concentrated dispersions of the present invention, the nanometric copper particles having an average secondary particle size ($d_{50}$) within a range of 20 to 200 nm. The particulate matter in these dispersions may contain more than 10% single-crystal metallic copper particles, and more typically, mostly or predominantly single-crystal metallic copper particles.

It must be emphasized that the production of a single crystal particle having a diameter of 80 nm is over 500 times the size of a single crystal particle having a diameter of 10 nm [$(80/10)^3=512$]. The growth of a single crystal particle from a diameter of 10 nm to 80 nm within a solvent requires over 500 times the deposition of supersaturated copper onto a 10 nanometer single crystal particle, than was require to initially form the 10 nanometer single crystal particle.

In crystallization processes, competing mechanisms, including nucleation and agglomeration, may interfere, or even predominate, with respect to crystal growth. In the case of reactive precipitation processes, in which sparingly soluble materials and the like are precipitated out of solution in a reactive process, these competing processes may be greatly favored, particularly in view of the extremely high global supersaturation levels, and even higher local supersaturation levels. These competing processes may further be favored due to the presence of solid reactant particles, around which the local supersaturation may be even higher, favoring nucleation and agglomeration over crystal growth. In the methods of the present invention, the copper particles are precipitated out of solution in such a reactive process. Hence, the production of copper particles that are mostly or predominantly single crystal copper particles would appear to be, at the very least, unexpected. The production of a single crystal copper particle product having a $d_{50}$ of 20 nm, and typically more, is surprising.

2. Concentration of the Copper Particles within the Dispersion

The concentration of nanometric copper particles within the concentrated dispersions of the present invention is typically within a range of 5% to 90%, by weight. The production of the nanoparticles is typically performed whereby a relatively dilute dispersion is obtained. The workup of the dilute dispersion, which may include washing, solvent addition and/or replacement, etc., may be a major contributor to the agglomeration of copper nanoparticles. The inventive process, described hereinbelow, produces a high percentage of single crystal copper nanoparticles in the reaction stage, and largely preserves that high percentage by averting, to a large degree, the agglomeration of the copper nanoparticles.

3. Percentage of Single Crystal Copper Particles within the Copper Particles, by Weight In the concentrated dispersions of the present invention, the nanometric copper particles may be partially, mostly or predominantly single crystal copper particles, on a weight basis, on a particle number basis, or on a cross-sectional basis. The presence of single crystal particles was qualitatively demonstrated by means of Electron Back Scattered Diffraction (EBSD). Quantification of the results was achieved by performing a plurality of scans at randomly chosen points, as described in greater detail hereinbelow. We have found that in our inventive dispersions, at least 10% of the nanometric copper particles are single crystal metallic copper particles, and more typically, at least 15%, at least 20%, at least 25%, at least 30%, at least 40%, at least 50%, at least 60%, at least 70%, or at least 80% of the nanometric copper particles are single-crystal metallic copper particles.

4. Concentration Ratio of Crystalline Cuprous Oxide to Nanometric Metallic Copper.

The concentrated dispersions of the present invention may contain a small percentage of cuprous oxide ($Cu_2O$), resulting from reaction of copper nanoparticles with oxygen. The presence of cuprous oxide was qualitatively demonstrated by means of Powder X-Ray Diffraction (Powder XRD). We have found that in our inventive dispersions, the concentration ratio of crystalline cuprous oxide to nanometric crystalline metallic copper is at most 0.4, at most 0.35, or at most 0.30, and typically, at most 0.25, at most 0.20, at most 0.15, at most 0.12, at most 0.10, at most 0.08, at most 0.06, or at most 0.03.

5. Electrical Resistivity of the Particulate Matter in the Dispersion

In the concentrated dispersions of the present invention, the particulate matter, and particularly of the copper particles, following thermal sintering, may be characterized by specific ranges of electrical resistivity. The electrical resistivity of the particulate matter was measured using Four Point Probe (4PP) method. We have found that in our inventive formulations, following standard thermal sintering of the particulate matter at 300° C. for 30 minutes as described in further detail hereinbelow, the electrical resistivity is at most $5 \times 10^{-3}$ ohm·cm, and more typically, at most $2 \times 10^{-3}$ ohm·cm, at most $1 \times 10^{3}$ ohm·cm, at most $8 \times 10^{-4}$ ohm·cm, at most $5 \times 10^{-4}$ ohm·cm, at most $2 \times 10^{-4}$ ohm·cm, or at most $1 \times 10^{-4}$ ohm·cm. The specific electrical resistivity of the sintered particulate matter may be within a range of $5 \times 10^{-5}$ to $5 \times 10^{-3}$ ohm·cm, within a range of $8 \times 10^{-5}$ to $2 \times 10^{-3}$ ohm·cm, or within a range of $1 \times 10^{-4}$ to $1 \times 10^{-3}$ ohm·cm.

6. Viscosity of the Dispersion

In the concentrated dispersions of the present invention, the viscosity of the dispersion may greatly affect the possible applications for which the dispersion may be used. For example, dispersions suitable for inkjet printing may require a viscosity of about 5-60 cP, and more typically, 5-40 cP, at the jetting temperature.

Various aspects of the materials and process used to produce the dispersion influence the viscosity of the resulting dispersion, including the type of dispersant used and its concentration in the dispersion, the type of solvent used and its concentration in the dispersion, and the concentration of solids in the dispersion.

We have found that the particulate matter in the inventive formulations may contain a high percentage of relatively smooth-sided nanoparticles, and more particularly, single-crystal copper nanoparticles. We have also found that the particulate matter in the inventive formulations may require less dispersant per unit weight of the particulate matter, with respect to various other nanometric copper particles. Without wishing to be bound by theory, the inventors believe that this structural feature contributes to the ability of the inventive dispersions to require relatively small concentrations of dispersant (or dispersant-layer thickness), while maintaining physical and chemical stability over at least six months, at least twelve months, or at least eighteen months of storage. Moreover, use of the inventive particulate matter within various dispersions may appreciably reduce the viscosity of these dispersions, relative to similar dispersions employing nanometric copper particles of the prior art.

The viscosity of the dispersion was measured for various concentrations of copper particles, as described hereinbelow. We have found that in our inventive dispersions, the viscosity at 25° C. is at most 1000 cP, at most 5000 cP, or at most 2000 cP, and more typically, at most 1000 cP, at most 600 cP, at most 300 cP, at most 200 cP, at most 120 cP, at most 80 cP, at most 60 cP, at most 45 cP, at most 35 cP, at most 25 cP, or at most 20 cP.

Referring now to the drawings, FIG. 1 is a schematic block diagram of a method of producing a nanometric copper product, according to one aspect of the present invention. The method may include the following steps:

Step 1: reducing cupric ions in an aqueous medium using a borohydride, in a presence of a first dispersant, to produce nanometric metallic copper particles, the copper particles having an average secondary particle size within a range of 20 to 200 nm;

Step 2: purifying the copper particles of Step 1; the aqueous medium may also be partially removed from the particles, to form a concentrate containing most of the copper particles;

Step 3: introducing, to the purified copper particles, at least one solvent, and replacing most or all of the aqueous medium therewith.

Various embodiments of the inventive method of producing a nanometric copper product will now be described in further detail.

Step 1

At least one soluble copper compound is dissolved in an aqueous solvent to form a first, aqueous solution containing dissolved cupric ions. The reducing agent, an alkaline borohydride (e.g., sodium borohydride or potassium borohydride) may then be incrementally added, e.g., in a semi-continuous fashion, preferably under vigorous stirring to this first solution.

Assuming that the soluble copper compound is cupric chloride, and that alkaline borohydride is sodium borohydride, the overall reaction stoichiometry may be substantially as follows:

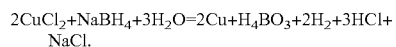

$$2CuCl_2+NaBH_4+3H_2O=2Cu+H_4BO_3+2H_2+3HCl+NaCl.$$

However, various side or competing reactions may occur.

An anti-foaming agent may be introduced to control, prevent, or reduce foaming in any of the process steps, as necessary. Typically, the anti-foaming agent may be added prior to introduction of the alkaline borohydride to the first solution.

Once the first solution is formed, and throughout the introduction of the second solution and the chemical reaction between components of the first solution and the second solution, an inert gas, such as argon, may be constantly blown or bubbled through the solution, in order to reduce oxidation of the copper particles within the dispersion.

The vigorous mechanical mixing may be applied, and may begin within an ambient temperature range (typically between 10° C. and 35° C.).

Various dispersants may be used within the reaction mixture, most notably, polyvinylpyrrolidone (PVP). The presence of such a dispersant may reduce or substantially inhibit agglomeration of the particles during the reaction and prior to subsequent processing.

The use of PVP has been found to be particularly advantageous. While the average molecular weight of PVP may be in the range of about 2,000 to about 3,000,000 gram/mole, the inventors have found to be particularly effective, in most cases, PVP molecules having a weight average molecular weight of about 8,000 to 700,000 gram/mole, 10,000 to 500,000 gram/mole, 10,000 to 350,000 gram/mole, 10,000 to 250,000 gram/mole, 10,000 to 200,000 gram/mole, 10,000 to 150,000 gram/mole, or 10,000 to 100,000 gram/mole. More typically, the average molecular weight of the PVP is at least 15,000 grain/mole, at least 20,000 gram/mole, at least 25,000 gram/mole, at least 30,000 gram/mole, or at least 35,000 gram/mole.

In producing various formulations and dispersions of the present invention, the inventors have found it to be advantageous to form single-crystal metallic copper particles, without these particles undergoing agglomeration or appreciable agglomeration. The copper nanoparticle formation reaction, described in detail hereinbelow, may advantageously be effected in an acidic solution containing at least one dissolved copper salt.

The pH of the solution may be monitored throughout the reaction. The inventors have observed that the pH may first decrease, as the borohydride is incrementally added to the reaction mixture. As the incremental addition of the borohydride is continued, the pH may subsequently rise in a largely monotonic fashion, from a highly acidic pH, that may be close to zero, to a pH of at least 2, and up to about 10.

The inventors have surprisingly discovered that when the pH is allowed to rise above a particular cutoff point, agglomeration of the copper particles may disadvantageously ensue. More particularly, as the cut-off pH was increased above 7, above 7.5, above 8, above 8.5, or above 9, increased agglomeration was observed in several experiments. In general, higher basic pH was correlated with higher extent of agglomeration. Therefore, in accordance with the present invention, the incremental addition of the borohydride is curtailed, and the copper nanoparticle forming reaction is concluded, at an end-point corresponding to a reaction mixture of at most 7, at most 6.5, at most 6, at most 5.5, at most 5, at most 4.5, at most 4, at most 3.5, at most 3, or at most 2.5. The inventors have found, however, that at a pH below about 2.5, however, conversion of the copper values to metallic copper may be compromised.

Step 2

Typically, water or an aqueous solvent may be used to purify the resulting dispersion of Step 1 in a suitable purification system. The introduction of water or aqueous solvent to the purification system may be controlled to replace the spent aqueous liquor, while maintaining the concentration of the particulate matter (or copper particles), at any time, below a preset value (below 90%, by weight, and preferably below 80%, below 70%, or below 60%), to ensure that disadvantageous agglomeration does not occur, or is appreciably reduced. As a result, substantially all the salts and most of the dispersant in the aqueous liquor are removed without deleteriously changing the shapes or agglomerating the copper particles.

The aqueous solvent may contain, in addition to water, an organic solvent such as a polar organic solvent. The streams produced in Step 2 typically include a concentrate containing most of the nanometric copper particles, and a relatively dilute stream containing a lower concentration of the copper nanoparticles, and preferably, containing substantially none of the copper nanoparticles. In Step 2, substantially all of the salts, part of the dispersant, unreacted materials, by-product impurities and part of the liquid present with the formed copper particles, are removed. Often, particular values of the final concentration of the salts (based on the copper weight), of the dispersant (based on the copper weight), and of the copper particles (based on the dispersion weight) are preset, and the operation of Step 2 is considered finished when these preset values are met.

As described hereinabove with reference to Step 1, in order to prevent or at least reduce the oxidation of the copper nanoparticles, and the formation of copper oxides, Step 2 may advantageously be carried out under constant flow of an inert gas, such as argon.

We have found that Step 2 can be conducted in a microfiltration system such as a membrane purification system having at least one membrane capable of separating the copper particles from the aqueous liquor, without losing a fraction of the copper particles in the aqueous phase that would make the process economically unviable.

Alternatively, Step 2 may be conducted using a centrifugation system. However, this method of purification is less preferable, because the centrifugation procedure may cause appreciable agglomeration of the copper metal particles. In addition, the centrifuged nanoparticles must be re-dispersed to form the product dispersion, and the additional operations and handling may cause additional oxidation of the copper metal.

A microfiltration system and method of general relevance to the present invention is disclosed by Pagana et al., "Applied Pilot-Scale Studies on Ceramic Membrane Processes for the Treatment of Wastewater Streams" (Global NEST Journal, Vol. 8, No. 1, pp 23-30, 2006), and is incorporated in its entirety by reference into the specification, as if fully set forth herein.

At least one membrane of the membrane purification system should be capable of filtering off the nanometric copper particles in the dispersion. To this end, the characteristic pore size of this membrane may be within a range that is suitable to retain the nanometric copper particles. The membranes may be made of a metallic material, ceramic material, polymeric material, or of other materials that may be known to those of ordinary skill in the art.

Step 3

At least one organic solvent may replace most of the aqueous liquor of the purified dispersion obtained in Step 2, in a method similar to the method utilized in Step 2. The same purification system may be used. In displacing the aqueous liquor, a further purification of the copper particles is achieved, which may be essential for various products and applications.

However, the organic solvent may replace the aqueous liquor in an evaporation system in which the aqueous liquor is evaporated, with a concomitant addition of the desired organic solvent, in order to maintain a concentration of the particulate matter (or copper particles) below a particular, desired value. Typically, the concentration of the solids is at most 90%, at most 85%, or at most 80%, by weight.

Optionally, an additional decantation step may be added between washing the dispersion in Step 2 and changing the solvent of the dispersion in Step 3, in order to separate out large particles from the dispersion.

The organic solvent may advantageously be soluble in water, and may readily dissolve the dispersant or dispersants remaining from Step 2. Various solvents may be appropriate as solvents for Step 3 of the process, either alone or mixed with at least one additional solvent. These solvents include, but are not limited to glycols such as ethylene glycol, diethylene glycol, propylene glycol, and hexylene glycol; alcohols such as methanol, ethanol, propanol, isopropanol, butanol such as 1-butanol, benzyl alcohol, and terpineol; glycol ethers. These solvents may also be used as co-solvents.

Suitable glycol ethers which may be used for solvents include, but are not limited to, ethylene or propylene glycol monomethyl ether, ethylene or propylene glycol monoethyl ether, ethylene or propylene glycol monopropyl ether, ethylene or propylene glycol monobutyl ether, ethylene or propylene glycol mono-t-butyl ether, ethylene or propylene glycol monophenyl ether, diethylene or dipropylene glycol monomethyl ether, diethylene or dipropylene glycol monoethyl ether, diethylene or dipropylene glycol monopropyl ether, diethylene or dipropylene glycol monobutyl ether, triethylene glycol methyl ether or tripropylene glycol methyl ether (TPM), triethylene or tripropylene glycol monopropyl ether, and triethylene or tripropylene glycol monobutyl ether.

Various solvents may be less suitable or unsuitable for use in Step 3, including acetates such as propylene glycol methyl ether acetate (PMA), or acetone.

Shelf Life

By preparing the nanometric copper particles as described in Step 1, and by conducting the work-up procedure as described in Steps 2 and 3, the nanometric copper dispersions of the present invention may achieve exceptional stability (having a guaranteed shelf-life of at least 6 months, and more typically, at least 12 months, at least 18 months or at least 24 months).

The inventive dispersions may be characterized by very low specific resistivity values (at most $5 \times 10^{-3}$ ohm·cm, at most $2 \times 10^{-3}$ ohm·cm, at most $1 \times 10^{-3}$ ohm·cm, at most $8 \times 10^{-4}$ ohm·cm, at most $5 \times 10^{-4}$ ohm·cm, at most $2 \times 10^{-4}$ ohm·cm, at most $1 \times 10^{-4}$ ohm·cm, at most $8 \times 10^{-5}$ ohm·cm, at most $5 \times 10^{-5}$ ohm·cm, at most $2 \times 10^{-5}$ ohm·cm, or at most $1 \times 10^{-5}$ ohm·cm), as measured using Four Point Probe (4PP) method.

The inventive dispersions may be characterized by the particulate matter having an average secondary particle size ($d_{50}$) within a range of 20 to 200 nm. The particulate matter in these dispersions may primarily contain single-crystal metallic copper particles. The solids fraction (or "particulate matter") within the inventive dispersions may contain at least 10%, at least 15%, at least 20%, at least 25%, at least 30%, at least 40%, at least 50%, at least 60%, or at least 70% single-crystal metallic copper particles, as measured by EBSD.

The inventors have found that in producing the dispersion of nanometric copper particles of the present invention, partial oxidation of the metallic copper particles to cuprous oxide may be observed. However, under constant flow of an inert gas, such as argon, the oxidation reaction may be largely reduced or prevented. Thus, a concentration ratio of cuprous oxide to metallic copper within the particulate matter may be at most 0.4 or at most 0.35, and more typically, at most 0.30, at most 0.25, at most 0.20, at most 0.15, at most 0.12, or at most 0.10.

More particularly, the inventors have found that the inventive dispersion may be characterized by a low concentration ratio of crystalline cuprous oxide to nanometric crystalline metallic copper of at most 0.4 or at most 0.35, and more typically, at most 0.3, at most 0.2, at most 0.15, at most 0.2 at most 0.10, at most 0.09, at most 0.08, at most 0.06, or at most 0.03, as measured using powder X-ray diffraction (XRD).

Figure 2:
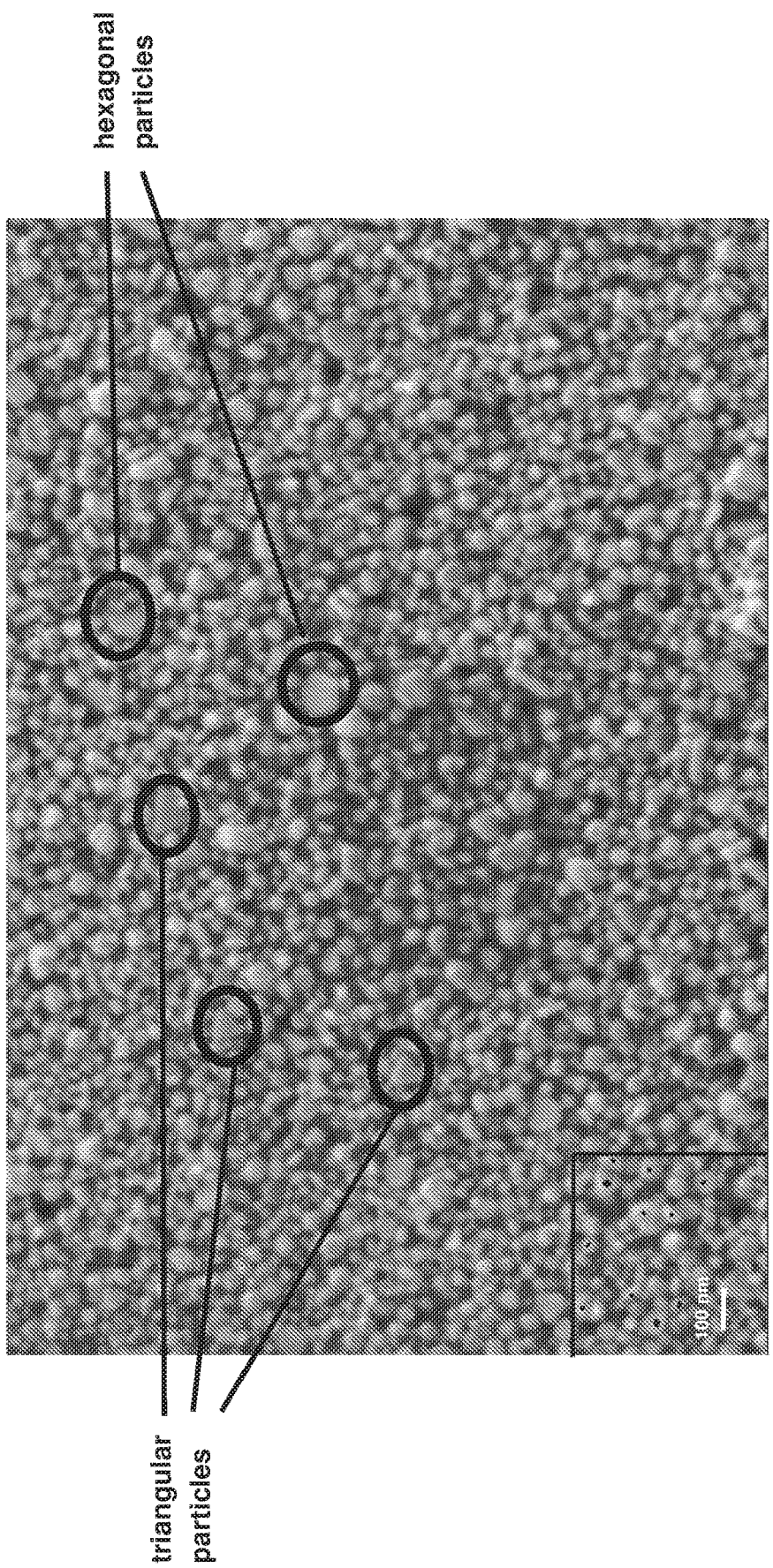
FIG. 2 is a High-Resolution Scanning Electron Microscopy (HRSEM) image showing a typical field containing nanometric copper particles produced according to an embodiment of the present invention, described in Example 3.
Figure 3:
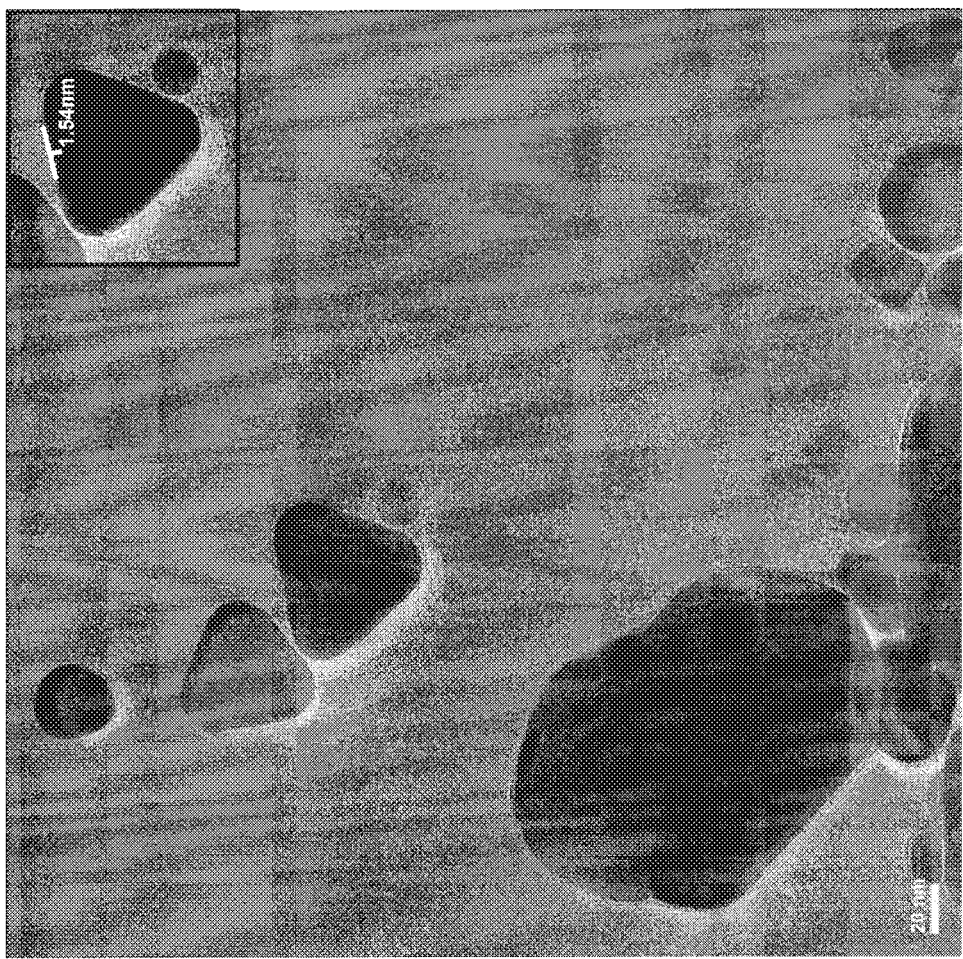
FIG. 3 is a Transmission Electron Microscopy (TEM) image showing a typical field containing nanometric copper particles produced according to an embodiment of the present invention, described in Example 4.

As can be seen in FIGS. 2 and 3, which are described in greater detail hereinbelow with reference to Examples 3 and 4, single-crystal metallic copper particles have a distinct geometrical shape, and have smoother surfaces than agglomerates or multi-crystal metallic copper particles.

Without being bound by theory, the smooth surfaces of the single-crystal metallic copper nanoparticles of the inventive formulations and dispersions may contribute to the low concentration of oxidized surface area. Without wishing to be limited by theory, the inventors believe that due to the smooth surfaces of the single-crystal copper nanoparticles, oxygen and water molecules may be poorly adsorbed onto the crystal surface, and may easily desorb, appreciably reducing the opportunity for reacting with adjacent copper atoms to produce the copper oxide. By contrast, the copper nanoparticle agglomerates or multi-crystal metallic copper nanoparticles may characteristically have a relative abundance of stabilized adsorption sites, leading to accelerated rates of attack on the copper surface, and higher ratios of copper oxide to copper.

The smooth surfaces of the single-crystal copper nanoparticles, and the reduced formation of cuprous oxides, as disclosed hereinabove, additionally contribute to the stability of the inventive dispersions disclosed herein. As described hereinbelow with reference to Example 17, the inventive dispersions may remain stable for at least 12 months, during which time the concentration of cuprous oxide or crystalline cuprous oxide in the dispersion increases by less than 7 percent, less than 5 percent, less than 3 percent, and more typically, less than 1.5 percent. In some cases, the inventors found that the concentration of cuprous oxide or crystalline cuprous oxide in the dispersion does not increase at all, even over periods of 15 months or 18 months.

The concentration of the inventive dispersions is greatly dependent on the volume of solvent added at Step 3, and on the specific application for which the dispersion will be used. That said, the inventive dispersions may be characterized by fairly low viscosity values (at most 10000 cP, and more typically, at most 5000 cP, at most 2000 cP, at most 1000 cP, at most 600 cP, at most 300 cP, at most 200 cP, at most 120 cP, at most 80 cP, at most 60 cP, at most 45 cP, at most 35 cP, at most 25 cP, or at most 20 cP) as measured at 25° C.

In another embodiment of the present invention, we have discovered that the purifying step (Step 2) may advantageously be effected by crossflow microfiltration, using micro-separation membranes. Such processes may be excessively and impractically slow when the size of the filtrate species approaches that of the membrane pore or opening. Moreover, microfiltration membrane processes may even be substantially impossible when the size of the filtrate species equals, or exceeds, the size of the membrane opening. A further, perhaps even more significant determent to using such separation processes relates to the relative size between the particles or species impeded by the micro-separators (such as micro-membranes), and the species that are supposed to pass through the micro-separators. We have discovered that certain dispersants, such as PVP, are effective to implement microfiltration purification.

Thus, according to one preferred embodiment of the present invention, the PVP dispersant has at least one narrow characteristic dimension/diameter with respect to the copper particles and with respect to the characteristic diameter of the membrane openings. This narrow characteristic dimension/diameter of the dispersant is preferably less than half the average secondary particle size of the copper particles.

Thus, while the average molecular weight of the polyvinylpyrrolidone should typically have a weight average molecular weight (MW) of less than 1,000,000, in order to pass through various suitable micro-membranes, the MW of the polyvinylpyrrolidone should preferably exceed about 8,000 to avoid reactivity and/or compatibility issues in either or both of the reaction steps. Despite the reduced separation efficiency, it is generally preferable for the PVP to have a MW of at least 20,000, at least 30,000, at least 40,000, or at least 50,000.

Hollow-fiber microfiltration membranes have been advantageously employed, but other ceramic, polymeric and/or metallic microfiltration membranes may also be fundamentally suitable. The membrane systems may be static or dynamic (e.g., having a vibrational mechanism for facilitating the separation).

Typical microseparation or microfiltration membranes for use in conjunction with the method of the present invention have one or more pores that are typically cylindrical, with a high length to width aspect ratio, through which the water/solvent and fine matter can pass. In many cases, the membrane is typically shaped like a long cylinder, but other geometries may be practical.

We have found that membranes having a pore diameter of less than 200 nm may be suitable for use in the process of the present invention. In some applications, the preferred pore diameter is less than 100 nm. Generally, the pore diameter or nominal pore diameter of the membrane may be at least 20 nm, and often, at least 40 nm, so as to enable various species to pass through the membrane openings, and so that the separation kinetics are not prohibitively slow.

According to another preferred embodiment of the present invention, the dispersant size and shape and the size of the membrane openings may be selected such that the dispersant molecules pass through the openings, while passage of the copper nanoparticles through the openings is hindered or substantially prevented.

EXAMPLES

Reference is now made to the following Examples, which together with the above description, illustrate the invention in a non-limiting fashion.

The chemicals used in effecting these Examples, and more generally, in the Specification, are identified hereinbelow:
  $CuCl_2.2H_2O$, 99%—Sigma-Aldrich
  $NaBH_4$—Acros organics
  polyvinylpyrrolidone (PVP), MW=55,000 Sigma-Aldrich.
  anti-foaming agent Contraspum 1012—Zschimmer Schwarz (Germany)
  ethylene glycol (EG)—Sigma-Aldrich
  propylene glycol (PG)—Sigma-Aldrich
  hexylene glycol (HG)—Sigma-Aldrich
  tripropylene glycol mono methyl ether (TPM)—Sigma-Aldrich
  diethylene glycol monomethyl ether (DGME)—Sigma-Aldrich
  ethanol—Sigma-Aldrich
  benzyl alcohol (BA)—Sigma-Aldrich
  Aqueous solutions were prepared by using deionized water using an Ionex water purification system (PuriTech, Dessel, Belgium). All reagents and solvents were used without further purification.

The instruments used in conjunction with the Examples are identified hereinbelow:

Particle size analyses ($d_{50}$) were performed using a Brookhaven 90Plus particle size analyzer (Brookhaven instruments Corporation, Holtsville, N.Y.). High Resolution Scanning Electron Microscopy (HRSEM) images were obtained using an HRSEM SUPRA-40 (Zeiss). Electron Back Scattered Diffraction (EBSD) Patterns were obtained using an attachment for orientation image microscopy (OIM) channel 5 (Oxford Instruments). Typical working conditions for EBSD: E=20 kV, working distance—15 mm, the resolution of the beam is approximately 30-40 nm, the spot size is 4.5, the probe current is about 0.5 nA, the collection time for EBSD pattern—300 msec, integration—50. EBSD image was taken using back electrons.

Samples for SEM measurements were prepared by placing 1 drop of diluted (1% w/w) Cu dispersion on a small piece of Si-wafer with following drying under vacuum (0.1 mbar) at room temperature.

High Resolution Transmission Electron Microscopy (HR-TEM) images were generally obtained using JEOL JEM- 2100 (LaB6) at 200 kV, integrated with a digital Scanning device (STEM) comprising annular Dark-Field (DF) and Bright-Field (BF) detectors and with a Thermo Scientific energy-dispersive X-ray spectrometer (EDS) system for elemental analysis. The TEM observations were made by taking BF and DF images, HRTEM images and selected area electron diffraction (SAED) patterns.

Samples for TEM measurements were prepared by placing a drop of diluted Cu dispersion (by factor of ~25,000) on a 400-mesh carbon-coated nickel grid.

XRD measurements were usually performed by a D5000 diffractometer (Siemens, Germany) operating with Ni-filtered Cu Kα radiation ($\lambda$=0.154 nm) at 40 kV, 40 mA, 2Θ range 20-80°, scanning step 0.03°, step time 2 sec.

Samples for XRD measurements were prepared as follows: copper nanoparticles (about 0.5-1 grams) were precipitated from dispersion using an excess of acetone and centrifugation under argon, rinsed several times with acetone, and dried by argon blow; then the obtained powder was mixed with apizone-M grease to prevent possible oxidation during following handling.

Thermal Gravimetric Analysis (TGA) was performed using a Universal V4.5A of TA Instruments®.

Evaporation was performed using a R-215 Rotavapor® evaporator equipped with a dry vacuum pump (20 mbar) (BÜCHI Labortechnik AG, Flawil, Switzerland).

Purification (filtration) of dispersions was conducted by using a crossflow membrane system that included hollow fiber membranes (Hyflux Membrane Manufacturing Ltd., Singapore).

Example 1

102 g $CuCl_2.2H_2O$ (0.6 mol) and 18.5 g PVP (MW=55,000) were dissolved in 900 ml de-ionized water (solution A). Ten drops of an anti-foaming agent (FOAMASTER® NXZ) were also introduced. Throughout the procedure, argon was blown into the liquid phase within the 3 L vessel. 45 g $NaBH_4$ were dissolved in 300 ml de-ionized water (solution B). Solution B was very gradually introduced into solution A (~7 cc/min.) under vigorous mechanical stirring (500-600 rpm). The initial temperature was about 25° C., the final temperature was below 70° C. Metallic copper nanoparticles were formed, and the addition of solution B was finished when the pH of the reaction mixture was 5.1. The dispersion was stirred for an additional 10 minutes, and was then transferred to a storage tank to await further treatment. The color of the obtained dispersion was dark-red, which is characteristic of copper nanoparticle dispersions.

A particle size analysis (Brookhaven 90Plus particle size analyzer) of reaction mixture after purification using cross-flow microfiltration (described hereinbelow) yielded an average particle size ($d_{50}$) of about 40 nm.

Example 2A

The dispersion produced in Example 1 was used, and additional quantities of solution B were gradually added to the dispersion. The pH of the dispersion solution reached 10.0. At this pH the metallic copper particles were highly agglomerated.

Example 2B

Example 1 was repeated, using 4.62 g of the PVP. Under these conditions, a significant portion of the metallic copper particles produced was agglomerated.

Example 2C

Example 1 was repeated, using 9.25 g of the PVP. Under these conditions, a portion of the metallic copper particles produced was agglomerated.

Example 2D

Example 1 was repeated, using 55.5 g of the PVP. Under these conditions, the metallic copper particles produced were found to be single crystals, but were much smaller than those obtained in Example 1.

Example 2E

Example 1 was repeated, using 37.0 g of the PVP. Under these conditions, the metallic copper particles produced were found to be single crystals, but were smaller than those obtained in Example 1.

Example 3

Purification of Cu Dispersion in Water 1300 ml of the dispersion from the reaction mixture from Example 1, containing about 37 g of the nanometric copper particles, was purified (washed) in a cross-flow microfiltration system, using about 50 L of de-ionized water.

The washing process was continued until the salts in the dispersion were practically eliminated, and the dispersant was reduced to a preset concentration of 3% of the weight of the copper particles. The final color of the obtained washed dispersion sample was dark-red, which is the characteristic color of copper nanoparticle dispersion.

The metal loading of the resulting washed dispersion of copper nanoparticles in water was about 5% w/w (calculated for $Cu^0$ metal). The % metal loading of the copper dispersion was determined by firing the small sample (0.5 g) at 600° C.; and was re-calculated to metallic Cu, assuming that all Cu was converted to CuO during firing.

A particle size analysis of the washed copper particles yielded an average particle size ($d_{50}$) of about 40 nm, using a Brookhaven 90Plus particle size analyzer.

An HRSEM image of the nanometric particles obtained is provided in FIG. 2 (magnification ×100,000). In this image, various types of non-agglomerated particles having single-crystalline morphology are present, such as easily observable triangles and hexagons, truncated octahedrons, truncated tetrahedrons and other geometrical shapes that may be typical for single-crystalline particles. In the exemplary 3.3 cm by 3.3 cm area field shown in the bottom left corner of the HRSEM image, the inventors positively identified at least 2.7 particles having a clear single crystal geometry, out of a total of 110 particles (24.5% on a per-particle basis). Some of these identified crystals are marked (dotted). It will be appreciated that with a clearer picture (or a higher resolution), many of the other 83 particles might also be positively identifiable as being single crystals.

Indeed, in some HRSEM fields or image frames, containing at least 20, at least 30, at least 50, or at least 100 particles, the inventors positively identified at least 25%, at least 35%, at least 40%, at least 50%, or at least 60% of the particles as having a clear single crystal geometry, on a per-particle basis.

Example 4

Replacing Water with an Organic Solvent
(Water-Ethylene Glycol Solvent Exchange)

A 600 ml portion of a dispersion of copper particles in water, containing about 30 g of the copper particles, which was prepared in a similar manner to that in Example 3, was introduced to a 2 L flask under constant blow of argon, and approximately 60 gr of ethylene glycol were added to the flask. The flask was then connected to the R-215 Rotavapor® evaporator, and after approximately 10 minutes of heating, the vacuum was gradually increased until distillation of water began, at 160 mbar. Vacuum conditions were maintained until distillation was complete. The resulting 60 ml copper dispersion contained about 24.4 g of nanometric copper and weighed about 84 g in total. Metal loading of the resulting dispersion in ethylene glycol was 29% (metallic copper); the viscosity was 34 cP (at 25° C.).

A particle size analysis of the copper dispersion after the water-ethylene glycol exchange yielded an average particle size ($d_{50}$) of about 40 nm.

FIG. 3 provides an exemplary HRTEM image of the nanometric copper particles obtained. These particles were stored ("aged") in ethylene glycol for over 18 months prior to undergoing characterization in the HRTEM. A majority of the particles were single crystalline FCC Cu having characteristic geometrical shapes, among them triangular and hexagonal particles (i.e., having triangular and hexagonal morphologies, respectively). Detailed analysis of HRTEM images showed that single-crystal particles remained almost entirely non-oxidized, and that a thin Cu oxide layer was mainly formed on the surface of non-single-crystal particles.

The inventors have found that the particulate matter in the inventive formulations may require less dispersant per unit weight of the particulate matter, with respect to various other nanometric copper particles. As shown in FIG. 3, the faces of the single crystals are extremely smooth, with a maximum deviation from flatness being only 1.54 nm in the exemplary measured crystal. The inventors believe that this structural feature contributes to the ability of the inventive dispersions to require relatively small concentrations of dispersant, while maintaining physical and chemical stability over at least six months, at least twelve months, or at least eighteen months of storage. Moreover, use of the inventive particulate matter within various dispersions may appreciably reduce the viscosity of these dispersions, relative to similar dispersions employing nanometric copper particles of the prior art.

The inventors believe that the inventive reaction method, and more particularly, the slow and gradual introduction of the borohydride into the acidic media, under vigorous stirring, appreciably contribute to the formation of the single crystals, and to the smoothness of the crystal faces.

The inventors have observed the physical stability of dispersions such as that described in Example 4, and have found such dispersions to be both physically stable and stable from an oxidation standpoint. Such dispersions retain their dark-red color and show no evidence of agglomeration.

In this exemplary HRTEM image frame may be observed 13 individual particles and one large agglomerate that are entirely or largely within the frame. Of the 14 particles, 6 may be identified as single crystals by their definitive geometrical shapes (marked with x). Of these, at least 2 are triangular and at least one is hexagonal (truncated). Thus, the observed ratio of single-crystal copper particles to the total number of particles is 6/14, or over 40%. The observed ratio of single-crystal copper particles having a triangular or hexagonal morphology, to the total number of particles, is 3/14, or over 20%.

Example 5

The presence of single-crystal copper nanoparticles was qualitatively demonstrated by means of Electron Back Scattered Diffraction (EBSD).

EBSD produces a diffraction pattern from the surface of the sample of particulate matter in the dispersion. The procedure, which will be readily understood to those of ordinary skill in the art of EBSD, is as follows:
1. The sample is scanned using a focused electron beam, and the diffraction pattern is obtained.
2. Interpretation of the diffraction image is performed using the instrument software (comparing basic copper crystallographic data);
3. The "solution" of the diffraction is matched, depicting the orientation of the crystal, correlating every kikuchi line to its fitting crystallographic plane in the lattice. If there is a perfect match between the kikuchi lines and the crystallographic planes (according to the theoretical data), the diffraction determines the orientation of a single crystal.

In the case of nanometric copper particles, a perfect solution may not always be obtained; sometimes there is no solution at all. This may indicate that the beam is located on a grain boundary. Alternatively, a perfect solution may not be obtained when the beam is located between two grains.

Example 6

Following the basic procedure of Example 5, we quantified the presence of single-crystal metallic copper nanoparticles within a sample of nanometric copper. Quantification was achieved by performing a plurality (at least 5, and preferably at least 10) of scans at randomly chosen points.

Figure 4:
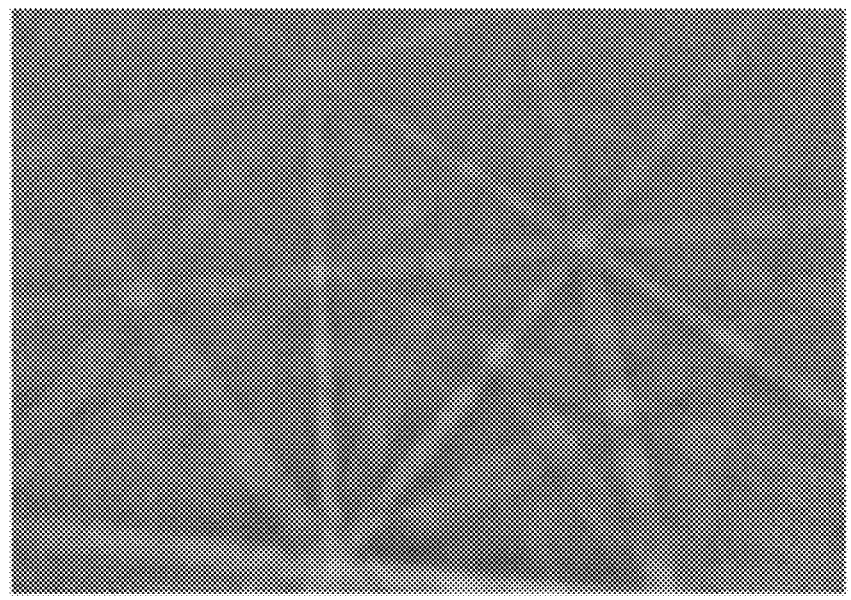
FIG. 4 is an Electron Back Scattered Diffraction (EBSD) pattern of the nanometric copper particles produced according the embodiment described in Example 4.
Figure 5:
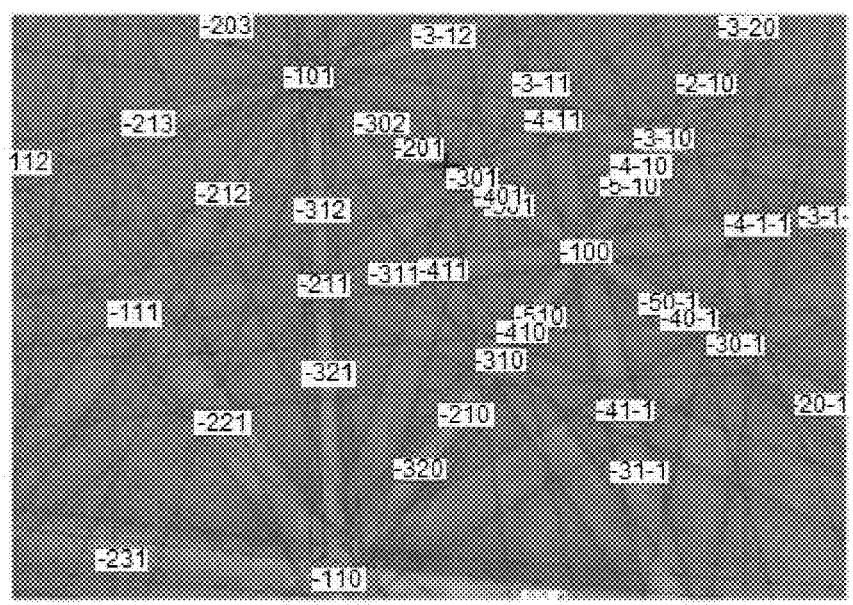
FIG. 5 provides identifications of various diffraction patterns characteristic of crystalline copper metal, based on the EBSD pattern provided in FIG. 4.

FIG. 4 is an Electron Back Scattered Diffraction (EBSD) pattern of the nanometric copper particles produced according the embodiment described in Example 4; FIG. 5 provides identifications of various diffraction patterns characteristic of crystalline copper metal, based on the EBSD pattern provided in FIG. 4.

For all randomly chosen scanned points, diffractions and matching solutions for copper single crystals were obtained. Each one of the obtained diffraction patterns determined a different crystal orientation. Analysis of the obtained misorientation distribution showed that the distribution was very close to the theoretical random distribution, and that there was no preferred orientation of the crystals in the sample; the crystals are "independent".

For samples with nanometric particles, there is a limitation of obtaining diffraction from the particle itself. Not in every place where the probe is positioned, is it possible to obtain a perfect diffraction pattern having a known solution. In the case that the grains/single crystals are somewhat smaller than 30-40 nm, it may be problematic to obtain clear diffraction patterns. Therefore, statistically speaking, the fact that we obtained diffraction patterns with solutions for different points of our sample, indicates that the grain size is at least ~30-40 nm. This value matches the average size of the particles in our sample obtained from the HRSEM image (FIG. 2) and from the PSD measurements. It is thus manifest that the particles in the inventive copper nanodispersion are mainly single crystals.

In testing the various nanometric copper-containing formulations of the present invention using EBSD, at least 10%, at least 20%, at least 30% or at least 50% of the scans produce a substantially perfect match for a single crystal copper nanoparticle. More typically, at least 60%, at least 70%, at least 80%, or at least 90% of the scans produce a substantially perfect match for a single crystal copper nanoparticle.

We have found that if at least 30% of the scans produce a substantially perfect match for a single crystal copper nanoparticle, then a majority of the nanometric copper particles are, in actuality, single crystal particles (based on the number of particles). If at least 50% of the scans produce a substantially perfect match for a single crystal copper nanoparticle, then at least 60%, and typically at least 70% of the nanometric copper particles are single crystal particles.

In theory, these quantitative EBSD scanning methods may provide a quantitative evaluation of a top layer or cross-section of the sample. In practice, however, this quantitative evaluation closely reflects the fraction of copper particles characterized as single-crystal copper particles, particularly for samples that do not have an extremely broad particle size distribution.

Example 7

FIG. 2 is a SEM image of a sample containing nanometric copper particles, produced according to the present invention. Randomly chosen locations in the sample were scanned at six locations. Using EBSD as described above, a perfect match for a copper single crystal was obtained in five of the six locations.

Each one of the diffractions produced in Example 6 had a different orientation. Moreover, the orientation distribution obtained was very close to the theoretical random distribution, indicating that no preferred orientation in the nanometric copper particles of the sample.

Example 8

Inventive dispersions of copper particles were deposited and thermally prepared for specific resistivity testing as follows:

The dispersion was printed as narrow lines on a microscope glass slide, by means of an air-operating dispenser. The slide with Cu lines was pre-heated (in air) at 100° C. for 10 minutes, followed by heating in oven at 300° C. for 30 minutes in an argon atmosphere. Typically, the line width is about 1 mm, and the thickness is about 10 micrometers.

Using a four-point probe measurement, the specific resistivity is obtained.

Example 9

An inventive dispersion of copper particles in ethylene glycol (EG) was prepared for specific resistivity testing according to the procedure provided in Example 8. The sample had a metal loading of approximately 25-29%.

The specific resistivity, determined according to the procedure provided in Example 8, was about $9 \times 10^{-5}$ ohm·cm, (×50 of bulk resistivity)

Example 10A

The presence of cuprous oxide within the copper nanoparticle formulations of the present invention was qualitatively and quantitatively demonstrated by means of Powder X-Ray Diffraction (XRD), using the copper dispersion produced in Example 4.

The nanometric copper product was prepared for X-Ray diffraction analysis according to the procedure provided hereinabove.

Figure 6:
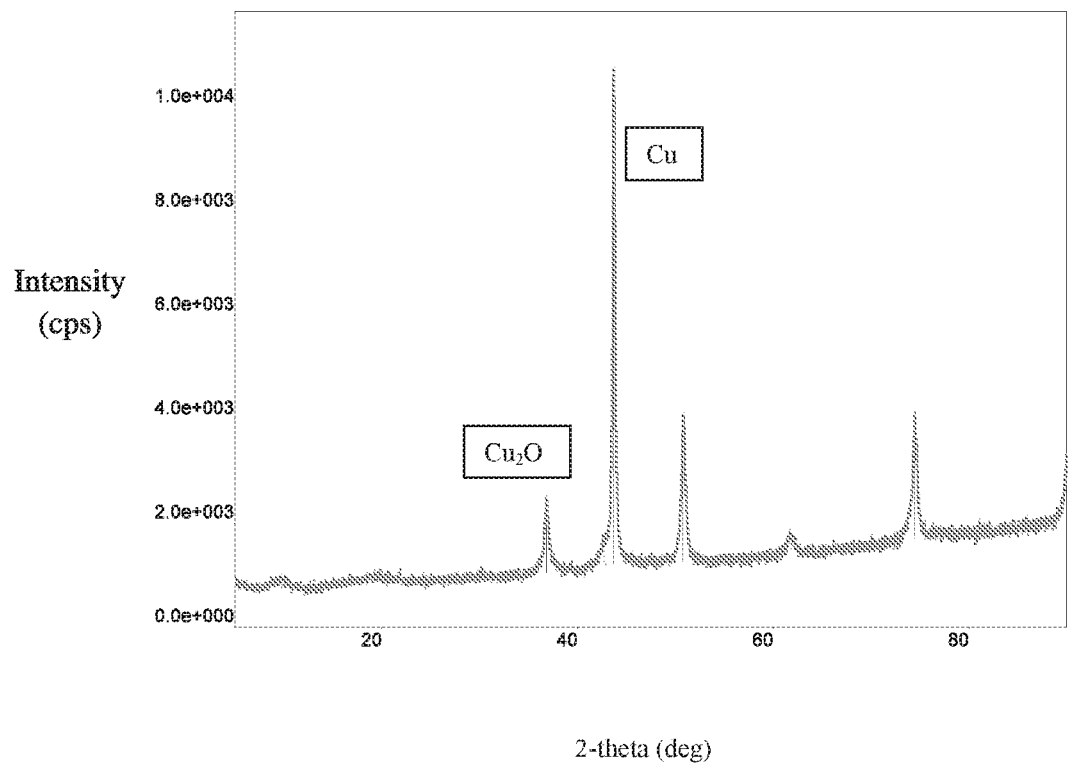
FIG. 6 provides a powder X-Ray diffraction pattern of a nanometric copper product, according to one aspect of the present invention.

FIG. 6 provides a powder X-Ray diffraction pattern of the inventive nanometric copper product. The peak positions and the full width at half maximum (FWHM), as a function of 2-theta, are provided in Table 1.

TABLE 1

| Peak No. | 2-theta (deg) | FWHM (deg) |
| --- | --- | --- |
| 1 | 36.803 | 0.48 (2) |
| 2 | 43.703 | 0.240 |
| 3 | 50.803 | 0.447 |
| 4 | 74.453 | 0.42 |

Since cuprous oxide has a 2-theta value of approximately 36.8 degrees, and metallic copper has a 2-theta value of approximately 43.7 degrees, the presence of two peaks in the XRD scan is indicative of the presence of cuprous oxide in the inventive dispersion; the relative intensity of these peaks is indicative of the relative concentration of copper metal and cuprous oxide in the dispersion.

The crystalline $Cu_2O$ content was quantitatively evaluated by calculating the peak area ratio between the main characteristic peaks of metallic Cu (2Θ=43.7 deg) and $Cu_2O$ (2Θ=36.8 deg).

Quantitative evaluation of the crystalline $Cu_2O$ content using XRD was performed on many samples, including the dispersions described in Examples 4, 11, 12, 13, 14 and 15. Some of the results are provided in Table 2 hereinbelow. The concentration ratio of crystalline $Cu_2O$ to metallic copper content (area of peak 1 to area of peak 2), was, for all examples, significantly below, 0.4, below 0.35, below 0.3, below 0.25, below 0.2, or below 0.15. In many cases, the weight ratio of crystalline $Cu_2O$ to total copper content was at most 0.12, at most 0.10, at most 0.08, at most 0.06, at most 0.05, at most 0.04, or at most 0.035.

Similarly the $Cu_2O$ concentration is defined as the area of peak 1 to the total area of peak 1 and peak 2.

Example 10B

An estimate of the average grain sizes of crystallites in the particulate matter of the dispersion, and particularly, of copper nanoparticles in the dispersion, may be obtained from the XRD scan. The average grain size, in nm, may be calculated using the data provided in Table 1, and using the Debye-Scherrer equation:

$$D = 0.9\lambda / \text{FWHM(rad)} \cdot \cos(\text{theta})$$

wherein:

$\lambda$ is the wavelength of the X-ray radiation, which, in the specific instrument used, was 0.1541 nm;

FWHM is the full width at half maximum of the peak (in rad), and is equal:

FWHM (deg)×3.14:180=0.24×3.14:180 (rad);

"theta" is the diffraction angle; "theta"=43.702:2;

A crystallite shape factor of 0.9 has been assumed. Thus, the grain size D(nm) of Cu nanoparticles is calculated as:

$$D = 0.9 \times 0.1541 / [(0.24 \times 3.14:180) \cdot \cos(43.702:2)] = \sim 36 \text{ nm.}$$

The strong agreement between this value, the average particle size of 40 nm measured by particle size analysis (Brookhaven 90Plus particle size analyzer), and the approximate size of normative particles observed in the HRSEM images suggests that the copper nanodispersion is comprised of particles that are mainly single crystals.

Example 11

Cu Dispersion in Ethylene Glycol with 60% Metal Loading

About 900 ml of a copper dispersion in water containing about 42 g of the copper particles, which was prepared as in Example 3, was introduced to a 2 L flask under a constant argon blow, and approximately 25 grams of ethylene glycol were added to the flask. The flask was then connected to the Rotavapor evaporator, and the water was distilled as in Example 4. The resulting 52 grams of copper dispersion (~20 ml) contained 31 grams of nanometric copper, corresponding to a metal loading of about 60% (metallic copper). The viscosity was about 1400 cP at 25° C.

Examples 12A and 12B

Cu Dispersion in Ethylene Glycol with Increased % Dispersant

Example 12A 1300 ml of the dispersion from the reaction mixture from Example 1, containing about 37 g of the nanometric copper particles, was purified (washed) in a cross-flow microfiltration system, until the salts in the dispersion were practically eliminated.

The applied washing mode was performed as follows: in each washing cycle 4 L of "fresh" de-ionized water was added to 1.3 L of concentrated dispersion; the dilution factor of each cycle was accordingly 5.3:1.3≈4.

The concentration of chloride ions in the reaction mixture was approximately 4 g/1300 ml≈32000 ppm; desired final concentration—below 10 ppm; required dilution factor: 32000:10=3200. Therefore, in order to wash out the salts, 6 washing cycles ($4^6$≈4100) were applied to reach the requisite dilution factor (>3200), or 24 L of water.

At that point of washing process, after applying only 24 L water, the dispersant level was reduced only to a concentration of 10% of the weight of the copper particles. The final color of the obtained washed dispersion sample was dark-red, which is the characteristic color of copper nanoparticle dispersion. The final dispersion was concentrated to 600 ml.

To 600 ml of purified copper dispersion in water with 10% dispersant/Cu ratio, containing ~28 g copper, were added 56 grams of ethylene glycol, under argon blow. The water was then distilled in a Rotavapor evaporator, as in Example 4. The resulting 82 grams of copper dispersion (~60 ml) contained 24 grams of nanometric copper, corresponding to a metal loading of about 29% (metallic copper). The viscosity was about 130 cP at 2.5° C. (comparing to 34 cP of sample with 3% dispersant in Example 4), exceeding the maximum viscosity limit for ink-jet printing.

Example 12B 1300 ml of the dispersion from the reaction mixture from Example 1, containing about 37 grams of the nanometric copper particles, was purified (washed) in a cross-flow microfiltration system.

8 washing cycles were applied, corresponding to about 32 L of de-ionized water. In each washing cycle, 4 L of "fresh" water was added to 1.3 L of concentrated dispersion, similar to example 12A.

After the washing cycles, the dispersant level was reduced to a concentration of 6% of the weight of the copper particles. The final color of the obtained washed dispersion was dark-red. The final dispersion was concentrated to 600 ml.

To 600 ml of purified copper dispersion in water with 6% dispersant/Cu ratio, containing ~27 g copper, were added 54 grams of ethylene glycol, under argon blow. The water was then distilled in a Rotavapor evaporator, as in Example 4. The resulting 79 grams of copper dispersion (~55 ml) contained 23 grams of nanometric copper, corresponding to a metal loading of about 29% (metallic copper). The viscosity was about 70 cP at 25° C.

Example 12C

Determination of Dispersant/Cu Ratio

Dispersant (PVP)/Cu weight/weight ratio, usually provided as w/w % PVP/Cu, can be measured by using Thermal Gravimetric Analysis (TGA).

Figure 7:
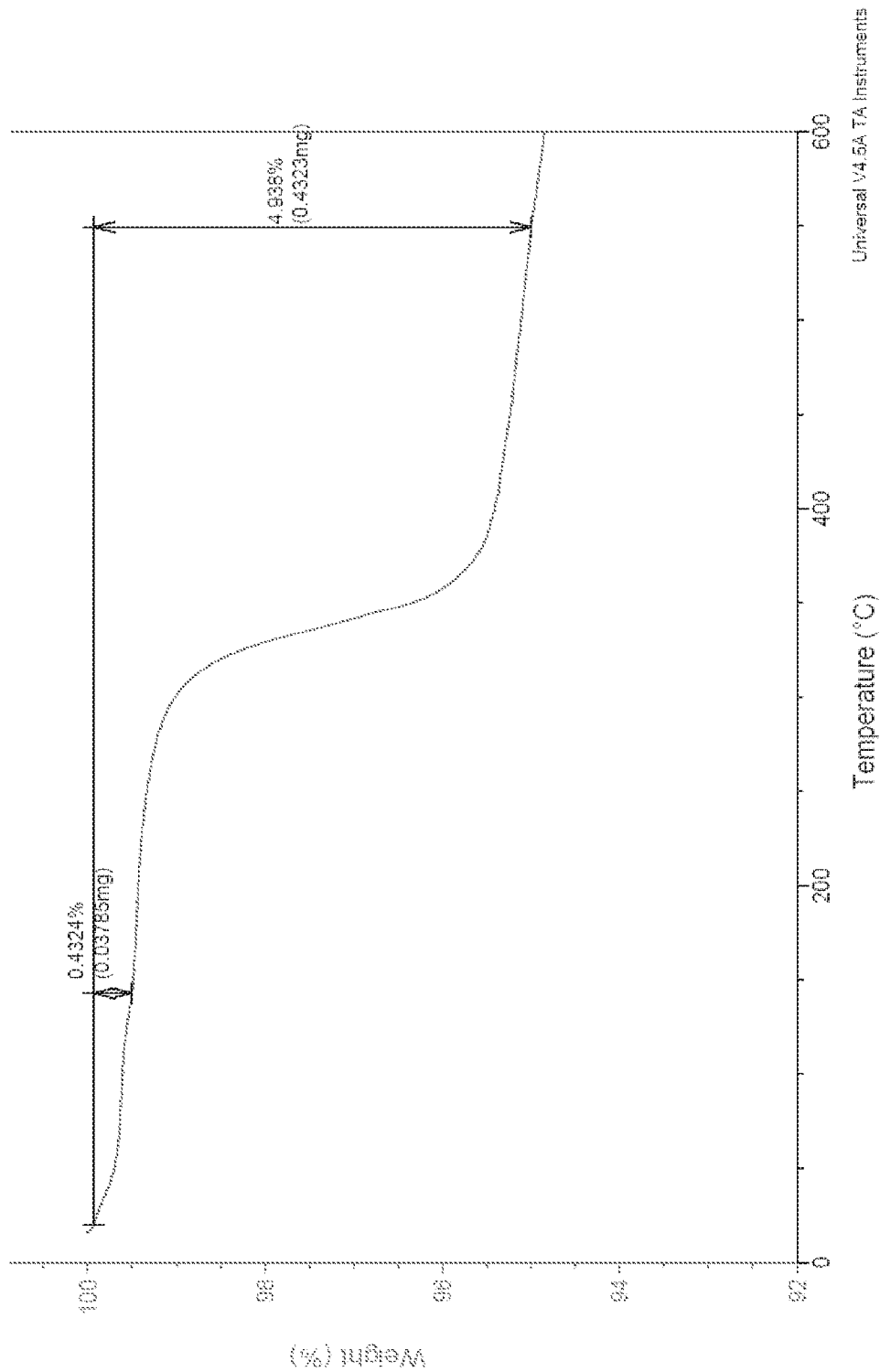
FIG. 7 provides a thermal gravimetric analysis (TGA) plot for a sample of copper nanoparticles in an inert atmosphere.

FIG. 7 provides a thermal gravimetric analysis (TGA) plot for the nanodispersion from Example 12(B), conducted in an inert atmosphere (argon) to prevent oxidation of copper metal during analysis. Prior to conducting TGA measurements, copper nanoparticles were dried from solvent (under argon), and an 8.75 mg sample of dried copper particles was analyzed. The sample was heated gradually to 600° C., with weight changes being monitored. The organic dispersant was totally decomposed between 300° C. and 500° C., leaving only clean copper metal at 600° C. The corresponding weight loss in the temperature range between 300° C. and 500° C., divided by the final weight of copper metal, yielded a dispersant/Cu ratio of approximately 5%.

Similar analyses were performed for the other copper nanodispersion samples.

Example 12D

Calculation of Dispersant Layer Thickness

Figure 8:
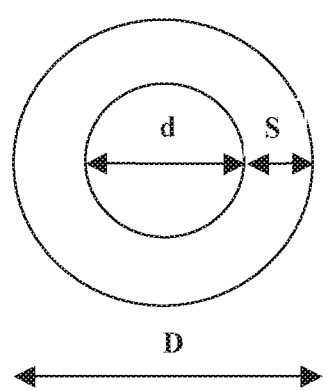
FIG. 8 is a conceptual representation of a copper nanoparticle enveloped by a dispersant layer.

In order to demonstrate the approximated values of thickness of dispersant (PVP) layer for different PVP/Cu ratios, the copper nanoparticle is often represented as a spherical particle having a copper metal core coated by an outer organic, polymeric shell, as shown in FIG. 8.

In this representation, the diameter of the copper core is d, the thickness (width) of the dispersant (from now on, PVP as a non-limiting example) layer is S, the diameter of the entire particle is such that D=d+2S.

The approximate values of S for different PVP/Cu ratios are calculated according to the following:

(1) The PVP/Cu weight ratio is measured for different samples, according to the procedure shown in Example 12(C), and is designated as K (% PVP/Cu=100K):

$$K = W_{PVP}/W_{Cu}$$

(2) Assuming that the densities of the two layers are substantially equal to literature values—Cu density is $\rho_{Cu}$=8.96 g/ml, PVP density is $\rho_{PVP}$=1.207 g/ml—the ratio of densities is:

$$\rho_{Cu}/\rho_{PVP} = 8.96/1.207 = 7.4$$

(3) Defining $V_{Cu}$ as the volume of the copper core, and $V_{PVP}$ as the volume of the PVP outer shell:

$$W_{PVP}/W_{Cu} = K = V_{PVP} \times \rho_{PVP}/V_{Cu} \times \rho_{Cu}$$

(4) From (3):

$$V_{Cu}/V_{PVP} = (\rho_{PVP}/\rho_{Cu})/K = 1/7.4K \text{ or } V_{PVP} = 7.4KV_{Cu}$$

(5) The volume of the whole particle is $V_D = V_{Cu} + V_{PVP}$ or, combining with (4):

$$V_D = V_{Cu} + 7.4KV_{Cu} = (1+7.4K)V_{Cu}$$

(6) From (5) it follows that:

$$V_D/V_{Cu} = 1 + 7.4K$$

(7) As the diameter ratio D/d for two spheres is equal to $(V_D/V_{Cu})^{1/3}$, and using (6):

$$D/d = (1+7.4K)^{1/3} \text{ or } D/d = \sqrt[3]{(1+7.4K)}$$

(8) Thus, for any chosen Cu core diameter d and measured PVP/Cu ratio K:

$$D = \sqrt[3]{(1+7.4K)}d, \text{ and } S = (D-d)/2$$

It must be emphazised that the ratio S/d in this model depends on the value of K, and that for a given K, S/d is the same for particles having different core diameters.

The calculation results for Examples 3, 12(A) and 12(B) are summarized in Table 2:

TABLE 2

Exemplary calculations of PVP layer width (S) and full particle diameter (D) for different PVP/Cu ratios and different Cu core diameters (d)

| Cu core diameter | % PVP/Cu = 3% K = 0.03 | | % PVP/Cu = 5% K = 0.05 | | % PVP/Cu = 10% K = 0.10 | |
|---|---|---|---|---|---|---|
| d, nm | S, nm | D, nm | S, nm | D, nm | S, nm | D, nm |
| 20 | 0.7 | 21.4 | 1.1 | 22.2 | 2.0 | 24 |
| 50 | 1.75 | 53.5 | 2.75 | 55.5 | 5.0 | 60.0 |
| 100 | 3.5 | 107 | 5.5 | 111 | 10 | 120 |
| 150 | 5.25 | 160.5 | 8.25 | 166.5 | 15 | 180 |

Example 13

Cu Dispersion in Propylene Glycol (PG)

To 600 ml of a copper dispersion in water containing about 28 grams of the copper particles, which was prepared as in Example 3, were added 60 grams of propylene glycol, under argon blow. The flask was then connected to the Rotavapor evaporator, and the water was distilled as in Example 4. The resulting 80 grams of copper dispersion (~60 ml) contained 21 grams of nanometric copper, corresponding to a metal loading of about 26% (metallic copper). The viscosity was about 40 cP at 25° C.

Example 14

Cu Dispersion in Hexylene Glycol (HG)

To 600 ml of a copper dispersion in water containing about 28 grams of the copper particles, which was prepared as in Example 3, were added 60 grams of hexylene glycol, under argon blow. The flask was then connected to the Rotavapor evaporator, and the water was distilled as in Example 4. The resulting 82 grams of copper dispersion (~60 ml) contained 24 grams of nanometric copper, corresponding to a metal loading of about 29% (metallic copper). The viscosity was about 180 cP at 25° C.

Example 15A

Cu Dispersion in Tripropylene Glycol Mono Methyl Ether (TPM)

In a first step, the water-ethanol solvent exchange was performed using a crossflow membrane system. For this, 600 ml of the copper dispersion in water, prepared as in Example 3, and containing about 30 grams of the nanometric copper particles, were "washed" using 2.5 L of ethanol.

In a second step, the ethanol-TPM solvent exchange was performed. To 400 ml of the copper dispersion in ethanol, containing about 24 grams of the copper particles, were added 58 grams of TPM, under argon blow. The ethanol was then distilled using a Rotavapor evaporator, as was done for water in Example 4. The resulting 80 grams of copper dispersion (~60 ml) contained 23 grams of nanometric copper, corresponding to a metal loading of about 29% (metallic copper). The viscosity was about 15 cP at 25° C.

Example 15B

Cu Dispersion in Diethylene Glycol Monomethyl Ether (DGME)

The procedure of Example 15A was repeated, but using diethylene glycol monomethyl ether (DGME) in the second step. To 400 ml of the copper dispersion in ethanol, containing about 24 grams of the copper particles, were added 16 grams of DGME, under argon blow. The copper dispersion obtained (38 grams) contained 23 grains of nanometric copper, corresponding to a metal loading of about 60.5% (metallic copper). The viscosity was about 40 cP at 25° C.

Example 16

Cu Dispersion in Benzyl Alcohol (BA)

To 100 ml of a copper dispersion in water containing about 5 grams of the copper particles, which was prepared as in Example 3, were added 10 grams of benzyl alcohol, under argon blow. A two-phase mixture was formed. The water was then distilled in a Rotavapor evaporator, as in Example 4. The final dispersion obtained (12 grams) was of a dark-red to violet color (characteristic of Cu nanodispersions), and was found to be (including by visual inspection and by optical microscope observation) a stable nanodispersion.

Example 17

Oxidation Stability ("Aging")

The exemplary dispersions described in Examples 4, 11, 12, and 15 were subjected to an oxidation stability ("aging") test at about 20° C. The results are provided in Table 3. In various samples, the concentration of the crystalline cuprous oxide (or "cuprous oxide concentration"—the area of peak 1 to the total area of peak 1 and peak 2, using powder XRD) was substantially maintained over the course of at least 1 month, at least 2 months, at least 3 months, or at least 12 months.

The particulate matter was adapted, and the dispersant and solvent were selected such that the cuprous oxide concentration within the particulate matter was maintained within 2 percent, within 1.5 percent, within 1.2 percent or within 1.0 percent, on an "absolute percentage" basis, over the course of at least 1 month, at least 2 months, at least 3 months, or at least 12 months (e.g., Example 15: [(8.5%-8.3%)=0.2%]).

Specifically, the amount of dispersant was maintained at at least 2%, at least 2.2%, at least 2.4%, or at least 2.6% of the weight of the copper particles. The particulate matter was produced according to the inventive method, in order to produce a high fraction of single crystals, as well as single crystals having particularly smooth faces. In order to obtain a viscosity suitable for ink-jetting, the amount of dispersant may be maintained at at most 5%, at most 4.5%, at most 4%, or at most 3.5%, of the weight of the copper particles. For dispersions containing relatively high amounts of dispersant and/or solids, solvents contributing to achieve a low viscosity (e.g., TPM) may be preferred.

TABLE 3

| Sample | % Dispersant | % $Cu^0$ in dispersion) | Viscosity cP (25° C.) | Amount of $Cu_2O$ (% w/w) based on XRD data | |
|---|---|---|---|---|---|
| | | % Cu total (expressed as | | As prepared, or ($Cu_2O$ (i)) | After time ($Cu_2O$ (t)) |
| Example #4 (in EG) | 3% | 29% | 34 cP | As prepared 7.4% | After 1 month 6.3% |
| Example #11 (in EG) | 3% | 60% | 1400 cP | As prepared 5.5% | After 12 months 5.8% |
| Example #12 (in EG) | 10% | 29% | 130 cP | As prepared 3.2% | After 2 months 3.2% |
| Example #15 (in TPM) | 3% | 29% | 15 cP | As prepared 8.3% | After 3 months 8.5% |

In another representation of the oxidative stability, the particulate matter was adapted, and the dispersant and solvent were selected such that the increase in cuprous oxide concentration over time, normalized by the total initial or previously measured concentration of copper (% Cu total), was maintained within a value V, the value V being expressed as a percentage and defined by:

$$V=100 \cdot (Cu_2O\ conc.(t) - Cu_2O\ conc.\ (i))/(\%\ Cu\ total),$$

wherein:
$Cu_2O$ conc.(i) is the initial or previously measured concentration of $Cu_2O$; and
$Cu_2O$ conc.(t) is a concentration of $Cu_2O$ evaluated at time t.

By way of example: in Example 15: V=[100·(8.5%-8.3%)/(29%)=0.69%]), over the course of 3 months.

More generally, the increase in cuprous oxide concentration over time, normalized by the total initial or previously measured concentration of copper, was maintained within a value V of 3%, 2%, 1.5%, 1%, 0.8%, 0.6%, 0.5%, or 0.4% over the course of at least 2 months, at least 3 months, or at least 12 months.

In an additional example, the dispersion of Example 15 was aged at room temperature for a total of 7 months, and the cuprous oxide concentration after 7 months ($Cu_2O$ conc.(t=7)) was found to be 8.6%. For the 4-month period following the initial 3-month period, $$V=100 \cdot (8.6\%-8.5\%)/(29\%)=0.34\%,$$

where 29% is the total concentration of copper (% Cu total) in the dispersion, expressed as % $Cu^0$ in the dispersion.

Example 18

"Reverse" Reaction

The same ratios of reagents were used as in Example 1, but in this case, $CuCl_2$ solution was added into the $NaBH_4$ solution.

10.2 grams $CuCl_2 \cdot 2H_2O$ (0.06 mol) and 1.8 grams PVP (MW=55,000) were dissolved in 90 ml of de-ionized water (solution A). 4.5 grams $NaBH_4$ and 0.6 grams PVP were dissolved in 30 ml of de-ionized water (solution B). Three drops of an anti-foaming agent were also introduced in solution B. Solution A was gradually introduced to solution B (~2 cc/min.) under mechanical stirring (400 rpm). Throughout the procedure, argon was blown through the reaction mixture. The initial temperature was about 25° C., and the final temperature was below 60° C. After the addition of solution A was finished, the pH of the reaction mixture was 6.0. The color of the obtained dispersion was yellow, the characteristic color of $Cu_2O$ nanoparticles, indicating that $Cu_2O$ was the main product of the "reverse" reaction.

In the formulations of the present invention, the weight ratio of the PVP to the particulate matter in the dispersion may be within the range of 0.01 to 0.5, 0.015 to 0.4, 0.015 to 0.4, 0.015 to 0.3, or 0.015 to 0.2. More typically, the weight ratio of the PVP to the particulate matter is at most 0.18, at most 0.16, at most 0.12, at most 0.08, at most 0.05, at most 0.04, at most 0.03, at most 0.025, at most 0.022, or at most 0.020.

Typically, the formulations of the present invention typically are free or substantially free of organometallic materials such as metal carboxylates. In some embodiments, such materials make up at most 8%, at most 6%, at most 4%, at most 2%, or at most 0.5% of the total weight of the particulate matter.

As used herein in the specification and in the claims section that follows, the term "average secondary particle size", with respect to particulate matter, refers to a mean diameter of the particulate matter, and is specifically meant to include the diameters of agglomerated particles as well as the diameters of single crystals.

As used herein in the specification and in the claims section that follows, the term "mean diameter", used with regard to dry particulate matter, refers to the mean diameter of the particulate matter, as determined by size measurements using a representative HRSEM image containing at least 50 particles, and according to robust techniques used by those of skill in the art.

As used herein in the specification and in the claims section that follows, the term "mean diameter", used with regard to particulate matter within a dispersion, refers to an equivalent spherical particle size ($d_{50}$), calculated using the Stokes-Einstein equation, by a Brookhaven 90Plus particle size analyzer (Brookhaven instruments Corporation, Holtsville, N.Y.), or if unavailable, by a functionally-equivalent particle size analyzer suited for measuring equivalent spherical particle size throughout the range of 5 to 2000 nm.

In determining this mean diameter, the particle size analysis is performed in a professional and reproducible manner using the particle size analyzer, by personnel trained and qualified to operate the particle size analyzer, and under the following conditions:
 (1) a representative sample of the particulate matter is taken;
 (2) the analysis is performed on a dispersion of the particulate matter in its respective liquid;
 (3) the analysis is performed at room temperature;
 (4) the scattering angle is 90 degrees.

As used herein in the specification and in the claims section that follows, the term "polyvinylpyrrolidone", also known as PVP, refers to a water-soluble polymer having or including the following molecular structure:

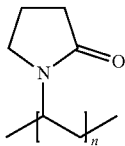

PVP is typically made from the vinyl pyrrolidone monomer, which has the following structure:

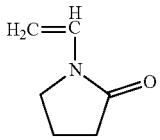

The market of PVP dispersants includes polymers produced by attaching (e.g., grafting) PVP onto other moieties. As used herein in the specification and in the claims section that follows, the term "polyvinylpyrrolidone" includes such dispersants. The term "pure polyvinylpyrrolidone" is meant to exclude such dispersants.

As used herein in the specification and in the claims section that follows, the term "single-crystal", and the like, with respect to metallic copper particles within particulate matter, refers to (unless designated otherwise) a single-crystal copper particle as determined by the standard Electron Back Scattered Diffraction (EBSD) method described in Example 5 hereinabove. Any quantitative assessment of a fraction or percentage of single-crystal particles within a sample, as used herein in the specification and in the claims section that follows, is performed according to the quantitative EBSD determination method described in Example 6, unless designated otherwise. While in theory, this quantitative EBSD scanning method provides a quantitative evaluation of a top layer or cross-section of the sample, in practice, this quantitative evaluation closely reflects the fraction of metallic copper particles having monocrystalline character, particularly for samples that do not have an extremely broad particle size distribution.

Thus, as used herein in the specification and in the claims section that follows, the term "majority", with respect to metallic copper particles, refers to at least one of the following: at least 30% of the randomly-selected EBSD scans produce a substantially perfect match for a copper single crystal, according to the procedure described in Example 6, or more than 50% of the copper particles, based on the number of copper particles.

As used herein in the specification and in the claims section that follows, the term "% Cu total", "total concentration of copper", "total initial concentration of copper", and the like, with respect to a formulation or dispersion, refers to the total amount of copper, in metallic and oxide forms, in the formulation or dispersion, and quantitatively expressed as % $Cu^0$ in the formulation or dispersion.

As used herein in the specification and in the claims section that follows, the term "standard sintering" or "standard thermal sintering" refers to the sintering procedure described in Example 8.

As used herein in the specification and in the claims section that follows, the term "concentration ratio", with respect to crystalline cuprous oxide and metallic copper particles and the like, refers to the area ratio of the crystalline cuprous oxide and the metallic copper, using powder XRD, as described in Example 10A.

As used herein in the specification and in the claims section that follows, the term "$Cu_2O$ concentration", or "cuprous oxide concentration" refers to the area of peak 1 to the total area of peak 1 and peak 2, using powder XRD, as described in Example 10A.

As used herein in the specification and in the claims section that follows, the term "primary" or "primarily", with respect to a phase, dispersant or solvent within a formulation or dispersion, refers to the largest component, by weight, within that phase, dispersant or solvent.

It will be appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination. Similarly, the content of a claim depending from one or more particular claims may generally depend from the other, unspecified claims, or be combined with the content thereof, absent any specific, manifest incompatibility therebetween.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A formulation comprising particulate matter including nanometric metallic copper particles, at least 10% of said particulate matter being single-crystal metallic copper particles, said particulate matter having an average secondary particle size ($d_{50}$) within a range of 20 to 200 nanometers (nm), said nanometric metallic copper particles being at least partially covered by at least one dispersant;
   a concentration ratio of crystalline cuprous oxide particles to said nanometric metallic copper particles, within said particulate matter, being at most 0.4;

at least 2% of said particulate matter being single-crystal metallic copper particles having a triangular morphology, as determined by manual counting of particles in a High Resolution Scanning Electron Microscope (HRSEM) field having at least 50 particles;

the formulation further comprising at least a first solvent, said particulate matter and said solvent forming a dispersion, a concentration of said particulate matter within said dispersion being within a range of 20% to 75%, by weight.

2. The formulation of claim 1, said dispersant forming a layer having a calculated thickness (S) within a range of 0.4-4 nm.

3. The formulation of claim 2, wherein said calculated thickness (S) is within a range of 0.4-2.5 nm.

4. The formulation of claim 2, said dispersant being a polymeric dispersant.

5. The formulation of claim 2, said dispersant including polyvinylpyrroli done (PVP).

6. The formulation of claim 1, said first solvent including at least one solvent selected from the group consisting of an alcohol, a glycol and a glycol ether.

7. A formulation comprising particulate matter including nanometric metallic copper particles, at least 10% of said particulate matter being single-crystal metallic copper particles, said particulate matter having an average secondary particle size ($d_{50}$) within a range of 20 to 200 nanometers (nm), said nanometric metallic copper particles being at least partially covered by at least one dispersant;

a concentration ratio of crystalline cuprous oxide to said nanometric metallic copper particles, within said particulate matter, being at most 0.4;

the formulation further comprising at least a first solvent, said particulate matter and said solvent forming a dispersion, a concentration of said particulate matter within said dispersion being within a range of 25% to 75%, by weight;

wherein a weight ratio of said dispersant to said particulate matter is at most 0.04, wherein a weight ratio of said dispersant to said particulate matter is at most 0.03 and at least 0.015; and where in at least 8% of said particulate matter being single-crystal metallic copper particles have a triangle morphology, as determined by manual counting of particles in a High Resolution Scanning Electron Microscope (HRSEM) field having at least 50 particles.

8. The formulation of claim 7, wherein a concentration of said particulate matter within said dispersion is within a range of 30% to 75%, by weight.

9. The formulation of claim 7, wherein said dispersant includes polyvinylpyrrolidone (PVP).

10. A formulation comprising particulate matter including nanometric metallic copper particles, at least 10% of said particulate matter being single-crystal metallic copper particles, said particulate matter having an average secondary particle size ($d_{50}$) within a range of 20 to 200 nanometers (nm), said nanometric metallic copper particles being at least partially covered by at least one dispersant;

a concentration ratio of crystalline cuprous oxide to said nanometric metallic copper particles, within said particulate matter, being at most 0.4;

the formulation further comprising at least a first solvent, said particulate matter and said solvent forming a dispersion, a concentration of said particulate matter within said dispersion being within a range of 15% to 70%, by weight;

wherein said dispersant includes polyvinylpyrrolidone (PVP);

wherein a concentration of said particulate matter within said dispersion is within a range of 30% to 65% by weight; and wherein at least 10% of said particulate matter being single-crystal metallic copper particles have a triangular morphology, as determined by manual counting of particles in a High Resolution Transmission Electron Microscope (HRTEM) image field having at least 10 particles.

11. The formulation of claim 10, at least 30% of said particulate matter being said single-crystal metallic copper particles.

12. The formulation of claim 11, at least 60% of said particulate matter being said single-crystal metallic copper particles.

13. The formulation of claim 10, said first solvent including at least one solvent selected from the group consisting of an alcohol, a glycol and a glycol ether.

\* \* \* \* \*